(12) United States Patent
Yang et al.

(10) Patent No.: US 7,557,372 B2
(45) Date of Patent: *Jul. 7, 2009

(54) MEMORY DEVICES BASED ON ELECTRIC FIELD PROGRAMMABLE FILMS

(75) Inventors: Yang Yang, Los Angeles, CA (US); Jianyong Ouyang, Los Angeles, CA (US); Charles R. Szmanda, Los Angeles, CA (US)

(73) Assignees: The Regents of the University of California, Oakland, CA (US); Rohm and Haas Company, Philadelphia, PA (US)

(*) Notice: Subject to any disclaimer, the term of this patent is extended or adjusted under 35 U.S.C. 154(b) by 53 days.

This patent is subject to a terminal disclaimer.

(21) Appl. No.: 11/882,225

(22) Filed: Jul. 31, 2007

(65) Prior Publication Data
US 2008/0095924 A1  Apr. 24, 2008

Related U.S. Application Data

(63) Continuation of application No. 10/927,174, filed on Aug. 25, 2004, now Pat. No. 7,274,035.

(60) Provisional application No. 60/500,082, filed on Sep. 3, 2003.

(51) Int. Cl.
*H01L 31/00* (2006.01)
(52) U.S. Cl. .................... 257/40; 257/E51.027
(58) Field of Classification Search ............ 257/40, 257/E51.027
See application file for complete search history.

(56) References Cited

U.S. PATENT DOCUMENTS

| 3,719,933 | A | 3/1973 | Wakabayashi et al. |
| 3,833,894 | A | 9/1974 | Aviram et al. |
| 4,144,418 | A | 3/1979 | Girard et al. |
| 4,371,883 | A | 2/1983 | Potember et al. |
| 4,507,672 | A | 3/1985 | Potember et al. |
| 4,652,894 | A | 3/1987 | Potember et al. |
| 4,663,270 | A | 5/1987 | Potember et al. |
| 4,987,023 | A | 1/1991 | Sato et al. |
| 5,075,738 | A | 12/1991 | Matsuda et al. |
| 5,136,212 | A | 8/1992 | Eguchi et al. |

(Continued)

FOREIGN PATENT DOCUMENTS

WO        WO 01/71814 A1    9/2001

(Continued)

OTHER PUBLICATIONS

English language translation of Chinese Office Action, issued in Application No. 2004100822303.

(Continued)

*Primary Examiner*—Ngan Ngo
(74) *Attorney, Agent, or Firm*—Venable LLP; Henry J. Daley

(57) ABSTRACT

A composition for the formation of an electric field programmable film, the composition comprising a matrix precursor composition or a dielectric matrix material, wherein the dielectric matrix material comprises an organic polymer and/or a inorganic oxide; and an electron donor and an electron acceptor of a type and in an amount effective to provide electric field programming. The films are of utility in data storage devices.

18 Claims, 8 Drawing Sheets

U.S. PATENT DOCUMENTS

| | | | |
|---|---|---|---|
| 5,238,607 | A | 8/1993 | Herron et al. |
| 5,543,631 | A | 8/1996 | Weinberger |
| 5,563,424 | A | 10/1996 | Yang et al. |
| 5,569,565 | A | 10/1996 | Kawakami et al. |
| 5,610,898 | A | 3/1997 | Takimoto et al. |
| 5,761,115 | A | 6/1998 | Kozicki et al. |
| 6,015,631 | A | 1/2000 | Park |
| 6,055,180 | A | 4/2000 | Gudesen et al. |
| 6,122,031 | A | 9/2000 | Terada et al. |
| 6,208,553 | B1 | 3/2001 | Gryko et al. |
| 6,229,047 | B1 | 5/2001 | Glaser et al. |
| 6,600,473 | B1 | 7/2003 | Kobayashi et al. |
| 6,631,085 | B2 | 10/2003 | Kleveland et al. |
| 6,774,880 | B2 | 8/2004 | Kobayashi |
| 6,828,685 | B2 | 12/2004 | Stasiak |
| 6,852,555 | B1 | 2/2005 | Roman et al. |
| 6,950,331 | B2 | 9/2005 | Yang et al. |
| 7,274,035 | B2 * | 9/2007 | Yang et al. .................... 257/27 |
| 2002/0010261 | A1 | 1/2002 | Callahan et al. |
| 2002/0031602 | A1 | 3/2002 | Zhang |
| 2002/0163828 | A1 | 11/2002 | Krieger et al. |
| 2002/0163831 | A1 | 11/2002 | Krieger et al. |
| 2002/0195600 | A1 | 12/2002 | Leuschner |
| 2003/0053350 | A1 | 3/2003 | Krieger et al. |
| 2003/0063362 | A1 | 4/2003 | Demir et al. |
| 2003/0155602 | A1 | 8/2003 | Krieger et al. |
| 2003/0173612 | A1 | 9/2003 | Krieger et al. |
| 2003/0178667 | A1 | 9/2003 | Krieger et al. |
| 2003/0179633 | A1 | 9/2003 | Krieger et al. |
| 2004/0026714 | A1 | 2/2004 | Krieger et al. |
| 2004/0159835 | A1 | 8/2004 | Krieger et al. |
| 2004/0160801 | A1 | 8/2004 | Krieger et al. |
| 2004/0246768 | A1 | 12/2004 | Krieger et al. |
| 2005/0111071 | A1 | 5/2005 | Kojima et al. |

FOREIGN PATENT DOCUMENTS

| | | |
|---|---|---|
| WO | WO 02/37500 A1 | 5/2002 |
| WO | WO 02/091496 A2 | 11/2002 |
| WO | WO2004064074 | 7/2004 |

OTHER PUBLICATIONS

Silva, et al., Bistable Switching And Memory Devices; Journal of non-Crystalline Solids; (1970) oo, 316-333 No. Holland Publishing Co., Amsterdam.

Bozano, et al; Mechanism for Bistability in Organic Memory Elements; Applied Physics Letters, (2004); vol. 84, No. 4, pp. 607-609; 2004 American Institute of Physics.

Hua, et al.; New Organic Bistable Films for Ultrafast Electric Memories; Applied Surface Science, 169-170 (20010 pp. 447-451,Elsevier Science B.V.

Beinhoff, et al., Poybiphenymethylenes: New Polymers for Bistable Organic Switches; Polymeric Materials: Science and Engineering 90, (2004) 211, 212, U.S.

Sezi, et al.; Organic Materials for High-Density Non Volatile Memory Applications; Proc. IEEE Int. Elec. Dev. Meeting; (2003); Germany.

Kevorkian, et al.; bistable Switching in Organic Thin Films; Dicussions of the Faraday Society, 51, (1971) pp. 139-142; U.S.

Pei, Qibing et al., Polymer Light-Emitting Electrochemical Cells, Science, New Series, vol. 269, No. 5227 (Aug. 25, 1995), pp. 1086-1088.

The Electrochemical Society—Current Affairs—Abstracts of "Recent News" Papers, Presented at Electronics Division Semiconductor Symposia, Los Angeles, CA (1962).

Ovshinsky, S.R., "Localized States in the Gap of Amorphous Semiconductors", Phys. Rev. Lett., vol. 36 (No. 24), Jun. 14, 1976, p. 1469-1472.

Y. G. Kriger, N.F. Yudanov, I.K. Igumenov, and S.B. Vashchenko, J. Struct. Chem. 34, 966 (1993).

Hovel, H.J. and J.J. Urgell, "Switching and Memory Characteristics of ZnSe—Ge Heterojunctions", J. Appl. Phys. 42, 5076 (1971).

Kumai, R., Y. Okimoto and Y. Tokura, "Current-Induced Insulator-Metal Transition and Pattern Formation in an Organic Charge-Transfer Complex", Science 284, 1645 (1999).

Garnier, F., R. Hajlaoui, A. Yassar and P. Shirakawa, "All-Polymer Field-Effect Transistor Realized by Printing Techniques", Science 265, 1684 (1994).

Hide, F., M.A. Diaz-Garcia, B.J. Schwartz, M.R.A. Andersson, Q. Pei and A.J. Heeger, Science 273, 1833 (1996).

Fujita, W. and K. Awaga, "Room-Temperature Magnetic Bistability in Organic Radical Crystals", Science, vol. 286 p. 261 (1999).

Burroughes, J.H., D.D.C. Bradley, A.R. Brown, R.N. Marks, K. Mackay, R.H. Friend, P. L. Burn and A.B. Holmes, "Light-Emitting Diodes Based on Conjugated Polymers", vol. 347, p. 539 (1990).

Yamada, T., D. Zou, H. Jeong, Y. Akaki and T. Tsutsui, "Recoverable Degradation and Internal Field Forming Process Accompanied by the Orientation of Dipoles in Organic Light Emitting Diodes", Synthetic Metals, 111-112, (2000).

Liu, J., Y. Shi, L.P. Ma and Y. Yang, "Device Performance and Polymer Morphology in Polymer Light Emitting Diodes: The Control of Device Electrical Properties and Metal/Polymer Contact", J. Appl. Phys. 88, 605 (2000).

Hamada, Y., C. Adachi, T. Tsutsui and S. Saito, "Blue-Light-Emitting Organic Electroluminescent Devices with Oxadiazole Dimer Dyes as an Emitter", Jpn. J. Appl. Phys. 31, 1812 (1992).

Kolega et al., Langmiur 1998, vol. 14, p. 5469-5478.

Schlaf et al., "Photoemission Spectrocscopy of LiF Coated Al and Pt Electrodes", Journal of Applied Physics, vol. 84, No. 12, pp. 6729-6736, (1998).

Beeler, F., O.K. Andersen and M. Scheffler", Theoretical Evidence for Low-Spin Ground States of Early Interstitial and Late Substitutional 3d Transition-Metal Ions in Silicon", Phys. Rew. Lett. 55, 1498 (1985).

Boyd, G.D., J. Cheng and P.D.T. Ngo, "Liquid-Crystal Orientational Bistability and Nematic Storage Effects", Appl. Phys., Lett. 36, 556 (1980).

Brown, W.D. and J.E. Brewer, "Nonvolatile Semiconductor Memory Technology", IEEE Press, New York (1998).

Chen, J., W. Wang, M.A. Reed, A.M. Rawlett, D.W. Price and J.M. Tour, "Room-Temperature Negative Differential Resistance in Nanoscale Molecular Junctions", Appl. Phys. Lett. 77, 1224 (2000).

Dewald, J.F., A.D. Pearson, W.R. Northover and W.F. Peck, Jr., "Semi-Conducting Glasses", Electrochem. Soc., 109, 243c (1962).

Faltermeier, C., C. Goldberg, M. Jones, A. Upham, D. Manger, G. Peterson, J. Lau, A.E. Kaloyeros, B. Arkles, and A. Paranjpe, "Barrier Properties of Titanium Nitride Films Grown by Low Temperature Chemical Vapor Deposition from Titanium Tetraoidide", J. Electrochemical Society, 144, 1002 (1997).

Gruler, H. and L. Cheung, "Dielectric Alignment in an Electrically Conducting Nematic Liquid Crystal", J. Appl. Phys. 46, 5097 (1975).

Istratov, A.A. and E.R. Weber, "Physics of Copper in Silicon", J. Electrochemical Society, 149, G21 (2002).

Istratov, A.A., C. Flink, H. Hieslmair, E.R. Weber and T. Heiser, "Intrinsic Diffusion Coefficient of Interstitial Copper in Silicon", Phys. Rev. Lett. 81, 1243 (1998).

Istratov, A.A., C. Flink, H. Hieslmair, S.A. Mchugo and E.R. Weber, "Diffusion, Solubility and Gettering of Copper in Silicon", Materials Science and Engineering Technology B, 72, 99 (2000).

Kaloyeros, A.E. and E. Eisenbraun, "Ultrathin Diffusion Barriers/Liners for Gigascale Copper Metallization", Annual Rev. Materials Science, 30, 363 (2000).

Krishnamoorthy, A., K. Chanda, S.P. Murarka, G. Ramanath and J.G. Ryan, "Self-Assembled Near-Zero-Thickness Molecular Layers as Diffusion Barriers for Cu Metallization", Appl. Phys. Lett. 78, 2467 (2001).

Lane, M.W., E.G. Liniger and J.R. Lloyd, "Relationship Between Interfacial Adhesion and Electromigration in Cu Metallization", J. Appl. Phys. 93, 1417 (2003).

Lee, K.L., C.K. Hu and K.N. Tu, "In-Situ Scanning Electron Microscope Comparison Studies on Electromigration of Cu and Cu(Sn) Alloys for Advanced Chip Interconnects", J. Appl. Phys. 78, 4428-4437 (1995).

Loke, A.L.S., J.T. Wetzel, P.H. Townsend, T. Tanabe, R.N. VRTIS, M.P. Zussman, D. Kumar, C. Ryu and S.S. Wong, "Kinetics of Copper Drift in Low-Kappa Polymer Interlevel Dielectrics", IEEE Transactions on Electron Devices 46, 2178 (1999).

Ma, L.P., J. Liu and Y. Yang, "Organic Electrical Bistable Devices and Rewritable Memory Cells", Appl. Phys. Lett. 80, 2997 (2002).

Ma, L.P., J. Liu, S.M. Pyo and Y. Yang, "Organic Bistable Light-Emitting Devices", Appl. Phys. Lett. 80, 362 (2002).

Ma, L.P., J. Liu, S.M. Pyo, Q.F. Xu and Y. Yang, "Organic Bistable Devices", Mol. Cryst. Liq. Cryst. 378, 185 (2002).

Ma, L.P., S.M. Pyo, Q.F. Xu and Y. Yang, "Nonvolatile Electrical Bistability of Organic/Metal-Nanocluster/Organic System", Appl. Phys. Lett. 82, 1419 (2003).

Ma, L.P., W.J. Yang, S.S. Xie and S. J. Pang, "Ultrahigh Density Data Storage from Local Polymerization by a Scanning Tunneling Microscope", Appl. Phys. Lett. 73, 3303 (1998).

McBrayer, J.D., R.M. Swanson and T.W. Sigmon, "Diffusion of Metals in Silicon Dioxide", J. Electrochem. Soc. 133, 1242 (1986).

Nakayama, K., K. Kojima, Y. Imaj, T. Kasai, S. Fukushima, A. Kitagawa, M. Kumeda, Y. Kakimoto and M. Suzuki, "Nonvolatile Memory Based on Phase Change in Se-Sb-Te Glass", J. J. Appl. Phys., Part 1, 42 (2A), 404 (2003).

Ostraat, M.L., J.W. De Blauwe, M.L. Green, L.D. Bell, M.L. Brongerma, J.R. Casperson, C. Flagan and H.A. Atwater,, "Synthesis and Characterization of Aerosol Silicon Nanocrystal Nanocrystal Nonvolatile Floating-Gate Memory Devices", Appl. Phys. Lett. 79, 433 (2001).

Patel, J.S., "Room-Temperature Switching Behavior of Ferroelectric Liquid Crystals in Thin Cells," Appl. Phys. Lett. 47, 1277 (1985).

Potember, R.S., T.O. Poehler and D.O. Cowan, "Electrical Switching and Memory Phenomena in Cu-TCNQ Thin Films", Appl. Phys. Lett. 34, 405 (1979).

Rosenberg, R., D.C. Edelstein, C.K. Hu, and K.P. Rodbell, "Copper Metallization for High Performance Silicon Technology", Annual Rev. Materials Science, 30, 229 (2000).

Segui, Y., Ai Bui and H. Carchano, "Switching in Polystyrene Films: Transition from On to Off State", J. Appl. Phys. 47, 140 (1976).

Sprang, H. A. van, and J.L. M. van de Venne, "Influence of the Surface Interaction on Threshold Values in the Cholestericnematic Phase Transition", J. Appl. Phys. 57, 175 (1985).

Wang, M.T., Y.C. Lin, and M.C. Chen, "Barrier Properties of Very Thin Ta and TaN layers Against Copper Diffusion", J. Electrochemical Society, 145, 2538 (1998).

Yang, K.H., T.C. Chieu and S. Osofsky, "Depolarization Field and Ionic Effects on the Bistability of Surface-Stabilized Ferroelectric Liquid-Crystal Devices", Appl. Phys. Lett. 55, 125 (1989).

K. Takimoto. H. Kawade, E. Kishi, K. Yano, K, Sakai, K. Hatanaka, K. Eguchi, and T. Nakagiri, Appl. Phys. Lett., 61, 3032 (1992).

H.J. Gao, K. Sohlberg, Z.Q. Xue, H.Y. Chen, S.M. Hou, L.P. Ma, X.W. Fang, X.W. Fang, S.J. Pang, and S.J. Pennycook, Phys. Rew. Lett. 84, 1780 (2000).

A. Bandyopadhyay and A.J. Pal, Appl. Phys. Lett. 82, 1215 (2003).

H.S. Majumdar, A. Bandyopadyay, A. Bolognesi, and A. J. Appl. Phys. 91, 2433 (2002).

D.M. Taylor and C. A. Mills, J. Appl. Phys. 90, 306 (2001).

Bachtold, Adrian et al., "Logic Circuits with Carbon Nanotube Transistors", Science, vol. 294, Nov. 9, 2001, pp. 1317-1320.

Duan, Xiangfeng et al., "Indium Phosphide Nanowires as Building Blocks for Nanoscale Electronic and Optoelectronic Devices", Nature, vol. 49, Jan. 4, 2001, pp. 66-69.

Gudiksen, Mark S. et al., "Growth of Nanowire Superlattice Structures for Nanoscale Photonics and Electronics", Nature, vol. 415, Feb. 7, 2002, pp. 617-620.

Huynh, Wendy U. et al., "Hybrid Nanorod-Polymer Solar Cells", Science, vol. 295, Mar. 29, 2002, pp. 2425-2427.

Adams, David M. et al., "Charge Transfer on the Nanoscale: Current Status", J. Phys. Chem. B., 2003, vol. 107, No. 28, pp. 6668-6697.

Kamat, Prashant V. et al., "Electrochemical Modulation of Fluorophore Emission on a Nanostructured Gold Film", Angew. Chem. Int. Ed. 2002, vol. 41, No. 15, pp. 2764-2767.

Chen, Shaowei et al., "Gold Nanoelectrodes of Varied Size: Transition to Molecule-Like Charging", Science, vol. 280, Jun. 26, 1998, pp. 2098-2101.

Wuelfing, W. Peter et al., "Electronic Conductivity of Solid-State, Mixed-Valent, Monolayer-Protected Au Clusters", J. Am. Chem. Soc. 2000, vol. 122, No. 46, pp. 11465-11472.

Ouyang, Jianyong et al., "Programmable Polymer Thin Film and Non-Volatile Memory Device", Nature Publishing Group, Nature Materials, vol. 3, Dec. 2004, pp. 918-922.

Hostetler, Michael J. et al., "Alkanethiolate Gold Cluster Molecules with Core Diameters from 1.5 to 5.2 nm: Core and Monolayer Properties as a Function of Core Size", Langmuir, 1998, vol. 14, No. 1, pp. 17-30.

Ouyang, Jianyong et al., "Electric-Field-Induced Charge Transfer Between Gold Nanoparticle and Capping 2-Naphthalenethiol and Organic Memory Cells", Applied Physics Letters, 86, 2005, pp. 123507-1 to 123507-3.

Scheinert, S. et al., J. Appl. Phys., 92 330 (2002).

Chiang, J.C., et al., Synth. Met. 13, 193, (1986). "Polyaniline: Protonic acid doping of the emeraldine form to the metallic regime."

Huang, J., et al., J. Am. Chem. Soc., 25, 314 (2003) "Poliianiline Nanofibers: Facile Synthesis and Chemical Sensors".

Virji, S., et al. Nano Lett., 4, 491 (2004). "Pollyaniline Nanofiber Gas Sensors: Examiner of Response Mechanisms".

Huang, J., et al., J. Am. Chem. Soc., 126, 851 (2004). "A General Chemical Route to Polyaniline Nanofibers" .

Furukawa, T., Adv. Colloid Interface Sci., 71-72, 183 (1997). "Structure and functional properties of ferroelectric polymer".

Tsuyoshi, T., et al., App. Phys. Lett., 83, 4978 (2003). "Electrical carrier-injection and transoprt characteristics of photochromic diarylethene films".

Reed, M.A., et al., Appl. Phys. Lett., 78, 3735 (2001). "Molecular random access memory cell".

Chen, Y., et al, Appl. Phys. Lett. 82, 1610 (2003). "Nanoscale molecular-switch devices fabricated by imprint lithography".

Tang, C.W. et al., "Organic Electroluminescent Diodes", Appl. Phys. Lett. 51 (12), Sep. 21, 1987, p. 913-915.

Friend, R.H. et al., "Electroluminescence in Conjugated Polymers", Nature, vol. 397, Jan. 14, 1999, p. 121-128.

Sariciftci, N.S. et al., "Photoinduced Electron Transfer from a Conducting Polymer to Buckminsterfullerene", Science, vol. 258, Nov. 27, 1992, p. 1474-1476.

Gundlach, D.J. et al., "Pentacene Organic Thin-Film Transistors-Molecular Ordering and Mobility", IEEE Electron Device Letters, vol. 18, No. 3, Mar. 1977, p. 87-89.

Baldo, Marc et al., "Organic Vapor Phase Deposition", Adv. Mater. 1998, 10, No. 18, p. 1505-1514.

Carchano, H. et al., "Bistable Electrical Switching in Polymer Thin Films", Applied Physics Letters, vol. 19, No. 19, Nov. 15, 1971, p. 414-415.

Xu, W. et al., "Two New All-Organic Complexes with Electrical Bistable States", Appl. Phys. Lett. 67 (15), Oct. 9, 1995, p. 2241-2242.

Ma, L.P. et al., "Data Storage with 0.7 nm Recording Marks on a Crystalline Organic Thin Film by a Scanning Tunneling Microscope", Applied Physics Letters, vol. 73, No. 6, Aug. 10, 1998, p. 850-852.

Henisch, H.K. et al., "Switching in Organic Polymer Films" Applied Physics Letters, vol. 24, No. 12, Jun. 15, 1974, p. 589-591.

Bryce, Martin R., "Tetrathiafulvalenes as π-Electron Donors for Intramolecular Charge-Transfer Materials", Advanced Materials, 1999, 11, No. 1, p. 11-23.

Martin, Nazario et al., "Evidence for Two Separate One-electron Transfer Events in Excited Fulleropyrrolidine Dyads Containing Tetrathiafulvalene (TTF)", J. Phys. Chem. A 2000, 104, p. 4648-4657.

* cited by examiner

MEMORY DEVICES BASED ON ELECTRIC FIELD PROGRAMMABLE FILMS

CROSS REFERENCE TO RELATED APPLICATION

This application is a continuation of U.S. application Ser. No. 10/927,174, filed Aug. 25, 2004, now U.S. Pat. No. 7,274,035, which claims the benefit of U.S. Provisional Application Ser. No. 60/500,082, filed Nov. 3, 2003, all of which are hereby incorporated in their entirety by reference.

This invention was made with Government support Grant No. F49620-02-1-0427 awarded by AFOSR. The Government has certain rights in this invention.

BACKGROUND

The present disclosure relates to electronic memory devices based on electric field programmable films. More particularly, the present disclosure relates to electronic memory devices that exhibit bistable behavior.

Electronic memory and switching devices are presently made from inorganic materials such as crystalline silicon. Although these devices have been technically and commercially successful, they have a number of drawbacks, including complex architecture and high fabrication costs. In the case of volatile semiconductor memory devices, the circuitry must constantly be supplied with a current in order to maintain the stored information. This results in heating and high power consumption. Non-volatile semiconductor devices avoid this problem but have reduced data storage capability as a result of higher complexity in the circuit design, which results in higher production costs.

Alternative electronic memory and switching devices employ a bistable element that can be converted between a high impedance state and a low impedance state by applying an electrical voltage or other type of input to the device. Both organic and inorganic thin-film semiconductor materials can be used in electronic memory and switching devices, for example in thin films of amorphous chalcogenide semiconductor organic charge-transfer complexes such as copper-7,7,8,8-tetracyanoquinodimethane (Cu-TCNQ) thin films, and in certain inorganic oxides in organic matrices. These materials have been proposed as potential candidates for nonvolatile memories.

A number of different architectures have been implemented for electronic memory and switching devices based on semiconducting materials. These architectures reflect a tendency towards specialization with regard to different tasks. For example, matrix addressing of memory location in a single plane such as a thin film is a simple and effective way of achieving a large number of accessible memory locations while utilizing a reasonable number of lines for electrical addressing. Thus, for a square grid having n lines in two given directions, the number of memory locations is $n^2$. This principle has been implemented in a number of solid-state semiconductor memories. In such systems, each memory location has a dedicated electronic circuit that communicates to the outside. Such communication is accomplished via the memory location, which is determined by the intersection of any two of the n lines. This intersection is generally referred to as a grid intersection point and may have a volatile or non-volatile memory element. The grid intersection point can further comprise an isolation device such as an isolation diode to enable addressing with reduced cross-talk between and among targeted and non targeted memory locations. Such grid intersection points have been detailed by G. Moore, Electronics, Sep. 28, (1970), p. 56.

Several volatile and nonvolatile memory elements have been implemented at the grid intersection points using various bistable materials. However, many currently known bistable films are inhomogeneous, multilayered composite structures fabricated by evaporative methods, which are expensive and can be difficult to control. In addition, these bistable films do not afford the opportunity for fabricating films in topographies ranging from conformal to planar. Bistable films fabricated using polymer matrices and particulate matter are generally inhomogeneous and therefore unsuitable for fabricating submicron and nanometer-scale electronic memory and switching devices. Still other bistable films can be controllably manufactured by standard industrial methods, but their operation requires high temperature melting and annealing at the grid intersection points. Such films generally suffer from thermal management problems, have high power consumption requirements, and afford only a small degree of differentiation between the "conductive" and "nonconductive" states. Furthermore, because such films operate at high temperatures, it is difficult to design stacked device structures that allow high density memory storage.

Accordingly, there remains a need in the art for improved electric field programmable bistable films that are useful as subsystems in electronic memory and switching devices, wherein such films can be applied to a variety of substrates and produced with a variety of definable topographies. Further, there is a need for electronic memory and switching devices comprising electric field programmable bistable films that can be produced more easily and inexpensively than known devices, that offer more useful differentiation between low conductivity and high conductivity states, that have reduced power and thermal requirements and that can be stacked in various configurations to fabricate electronic devices of higher density.

SUMMARY

In one aspect, a composition for the formation of an electric field programmable film, the composition comprising a matrix precursor composition or a dielectric matrix material, wherein the dielectric matrix material comprises an organic polymer and/or a inorganic oxide; and an electron donor and an electron acceptor of a type and in an amount effective to provide electric field programming.

In another aspect, an electric field programmable film comprises a dielectric matrix material, wherein the dielectric matrix material comprises an organic polymer and/or a inorganic oxide; an electron donor; and an electron acceptor.

In another aspect, a method for manufacturing an electric field programmable film comprising applying the composition of claim 1 to a substrate; and removing the solvent from the applied composition to form a film.

The present invention offers the advantages of simplicity of manufacture, higher device density and reduced cost of production. The electric field programmable film may be used in cross point array data storage devices, stacked data storage devices, and the like. In addition, the electric field programmable film may be used in devices having flexible plastic substrates, inorganic oxide substrates, optical devices, in switching elements for light emitting diodes, in switching elements of other electronic devices such as sensors, as actuation elements in micro-electro-mechanical systems (MEMS) devices and in control applications in microfluidic devices.

DETAILED DESCRIPTION

The electric field programmable film as defined herein is a film comprising active elements wherein the active elements are convertible from a first electrically conductive or polarized state to a second electrically conductive or polarized state by the application of a suitable forward bias voltage, and wherein the material is re-converted to its first electrically conductive or polarized state by the application of a suitable reverse bias voltage.

A forward bias voltage is an electrical signal applied to a device that promotes a change in a prescribed direction after the application of the bias voltage. A reverse bias voltage is the opposite of a forward bias voltage of the same magnitude.

The active element is also called the electric field programmable film element and as defined herein is an intersection between an electrode from a first set of electrodes and an electrode from a second set of electrodes that can be altered by the application of a first stimulus such that (a) the measured response is nonlinear or (b) the application of a subsequent, possibly different stimulus produces a different measured response than the application of the first stimulus.

A cross-point array is a device comprising a first set of substantially parallel electrodes (also referred to as lines) running along a first direction, a second set of substantially parallel electrodes running along a second direction, wherein an active element is formed within some or all of the spatial intersections between an electrode from the first set of electrodes and an electrode from the second set of electrodes and further wherein the first direction is at an angle of 1 to 179 degrees to the second direction and wherein the active element can be either continuous or pixelated.

Electric coupling as defined herein is that wherein a voltage or other signal on one electrode relative to a reference or ground signal on a second electrode can probe or change the state of the active element. Electrical coupling can be done via direct contact, or through an electrical coupling element which makes ohmic contact, contact via a conducting plug, capacitive contact, contact via an intervening tunnel junction, contact via an intervening isolation device such as a diode or a transistor or contact via other electrical devices.

Figure 1:
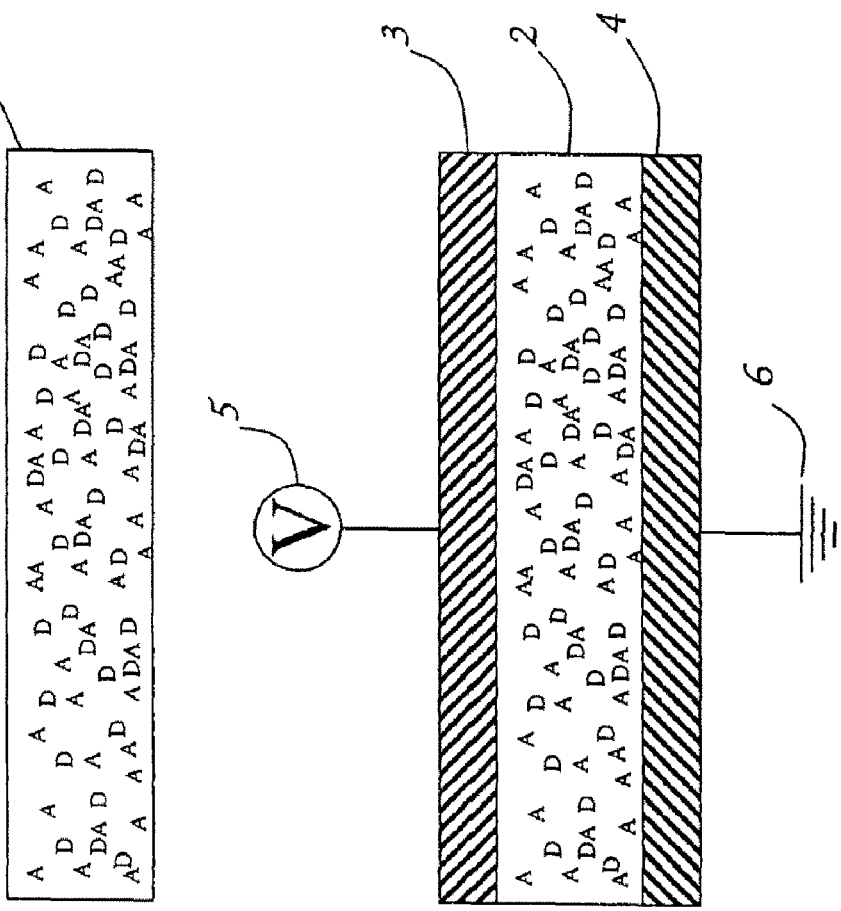
FIG. 1(a) shows a schematic of an electric field programmable film.
FIG. 1(b) shows another schematic of an electric field programmable film.

FIG. 1(a) shows a schematic of an electric field programmable film, 1, with a dielectric matrix material, electron donors (D), electron acceptors (A) and the optional donor acceptor complexes (DA). The electron donors (D), electron acceptors (A) and the optional donor acceptor complexes (DA) are also referred to as active components and respond to the application of a stimulus. Examples of such stimuli may include, but are not limited to, chemical, mechanical, electrical, magnetic, electromagnetic, electromechanical, magnetomechanical or electrochemical. An exemplary stimulus is an electrical stimulus.

The dielectric matrix material is the carrier material for one or more active components in an active element. The dielectric matrix material may or may not itself comprise an active component. Matrix materials utilized in the electric field programmable film composition are generally organic polymers or inorganic oxides. It is generally desirable for the dielectric matrix material to form hydrogen bonds with the electron donors and the electron acceptors. The hydrogen bonding lowers the free energy of the electric field programmable film while having very little effect on the energy of the transition state for electron transfer. Dielectric matrix materials that display dipole-dipole interactions or dipole-induced dipole interactions may also be used in the electric field programmable film. The dielectric matrix materials used in the electric field programmable films are organic polymers and/or inorganic; oxides.

It is desirable for the organic polymers used as the matrix materials to have dielectric constants of 2 to 1000. In one embodiment, the organic polymer has sufficient chemical and thermal resistance to withstand processes involving the deposition of metals, etch barrier layers, seed layers, metal precursors, photoresists and antireflective coatings. It is also desirable for the organic polymer to impart a low level of electrical conductivity to the electric field programmable film in the "off" state and to permit for a sufficiently high concentration of electron donors and electron acceptors to enable a sufficiently high conductivity in the "on" state so that the difference between the "off" state and the "on" state is readily discerned. Electrical conductivity of the dielectric matrix materials is less than or equal to about $10^{-12}$ ohm$^{-1}$ cm$^{-1}$. It is desirable for the ratio of the electrical current in the "on" state to that in the "off" state to be greater than or equal to 5, with greater than or equal to 100 being exemplary, and greater than or equal to 500 being even more exemplary.

An on/off ratio greater than 5 allows the "on" and "off" states of an electric field programmable film to be discerned readily while an on/off ratio greater than 100 allows the "on" and "off" states to be discerned more readily and an on/off ratio greater than 500 allows the "on" and "off" states to be discerned most readily. On/off ratios are engineered to meet the requirements of the device. For example, devices having high impedance sense amplifiers and requiring higher speed operation require larger on/off ratios, while in devices having lower speed requirements smaller on/off ratios are acceptable.

The organic polymers that may be used as matrix materials in the electric field programmable composition may be thermoplastics, thermosets, or blends of thermoplastics with thermosets. The organic polymers may be homopolymers, block copolymers, graft copolymers, star block copolymers, random copolymers, ionomers, dendrimers, or the like, or combinations comprising at least one of the foregoing organic polymers.

Organic polymers having dielectric constant of 2 to 1,000 can be used. The dielectric constant (denoted by κ) of the matrix material can be selected such that "on" and "off" switching voltages are engineered to conform to the specific requirements of the application. Within the aforementioned range, organic polymers having dielectric constants of greater than or equal to about 4 are exemplary, with greater than or equal to about 6 being more exemplary, and greater than or equal to about 7 being even more exemplary. Also desirable within this range is a dielectric constant of less than or equal to about 450, with less than or equal to about 400 being exemplary, and less than or equal to about 350 being more exemplary.

Examples of suitable organic polymers that may be used as the dielectric matrix materials in the electric field programmable film composition include, but are not limited to polyolefins, poly(meth)acrylates, polyesters, polyamides, novolacs, polysiloxanes, polycarbonates, polyimides, polyacetates, polyalkyds, polyamideimides, polyarylates, polyurethanes, polyarylsulfone, polyethersulfone, polyphenylene sulfide, polyvinyl chloride, polysulfone, polyetherimide, polytetrafluoroethylene, polychlorotrifluoroethylene, polyvinylidene fluoride, polyvinyl fluoride, polyetherketone, polyether etherketone, polyether ketone ketone, or combinations comprising at least one of the foregoing polymeric matrix materials.

Examples of suitable copolymers that may be used as the dielectric matrix material in the electric field programmable composition film include, but are not limited to copolyestercarbonates, acrylonitrile butadiene styrene, styrene acrylonitrile, polyimide-polysiloxane, polyester-polyetherimide, polymethylmethacrylate-polysiloxane, polyurethane-polysiloxane, or the like, or combinations comprising at least one of the foregoing copolymers.

Examples of suitable thermosetting polymers that may be used in the electric field programmable composition include, but are not limited to polyurethanes, natural rubber, synthetic rubber, epoxy, phenolic, polyesters, polyamides, silicones, or the like, or combinations comprising at least one of the foregoing thermosetting polymers.

In an exemplary embodiment, the organic polymer in the electric field programmable film composition may be in the form of a matrix precursor composition comprising monomers. In one embodiment, the matrix precursor composition may be polymerized into a homopolymer or copolymer prior to the casting of the electric field programmable film. In another embodiment, the matrix precursor composition may be polymerized into a homopolymer or a copolymer after the composition is cast onto a substrate to form the electric field programmable film.

Examples of suitable copolymers that may that may be used as matrix materials in the electric field programmable composition include copolymers made from monomers selected from styrene, hydroxystyrene, $C_1$-$C_{10}$ linear, branched or cyclic alkyl, $C_1$-$C_{10}$ linear, branched, or cyclic alkoxy, $C_6$-$C_{10}$ aryl, arylalkyl, aryloxy or arylalkyloxy substituted styrene, vinyl alcohol, vinyl acetate, (meth)acrylonitrile, (meth)acrylic acid, $C_1$-$C_{10}$ linear, branched, or cyclic alkyl, $C_6$-$C_{10}$ aryl or arylalkyl (meth)acrylate esters, $C_1$-$C_{10}$ cyanoacrylate monomers, or the like, or a combination comprising at least one of the foregoing monomers.

Polyester copolymers comprising $C_1$-$C_{10}$ linear, branched, or cyclic alkoxy; $C_1$-$C_{10}$ aryl, arylalkyl, aryloxy or arylalkyloxy dialcohols; $C_1$-$C_{10}$ linear, branched, cyclic alkoxy, $C_1$-$C_{10}$ aryl, arylalkyl, aryloxy or arylalkyloxy diacids may also be used in the electric field programmable composition. Polyamides comprising $C_1$-$C_{10}$ linear, branched, or cyclic alkoxy, $C_6$-$C_{10}$ aryl, arylalkyl, aryloxy or arylalkyloxy diamines; $C_1$-$C_{10}$ linear, branched, or cyclic alkoxy, $C_6$-$C_{10}$ aryl, arylalkyl, aryloxy or arylalkyloxy diacids may also be used in the electric field programmable composition.

The organic polymers or copolymers may have a number average molecular weight (Mn) of about 50 to about 1,000,000 grams/mole (g/mole). Within this range, molecular weights of for example greater than or equal to about 100, greater than or equal to about 500, and greater than or equal to about 1,000 g/mole may be used. Also desirable within this range are molecular weights of, for example, less than or equal to about 750,000, less than or equal to about 500,000, and less than or equal to about 250,000 g/mole.

As stated above, the dielectric matrix materials can be inorganic oxides. Exemplary inorganic oxides are those having a perovskite structure characterized as having a tetravalent or trivalent atom situated in an octahedral site with respect to the surrounding oxygen atoms. These materials have the general formula $$A_w B_x C_y O_z$$

where w, x, and y are 0 to 30, and z is 1 to 60; A is calcium, strontium, or barium, B is bismuth, zirconium, nickel or lead, and C is titanium, niobium zirconium vanadium, or tantalum. In an exemplary embodiment, the stoichiometry is constrained to give approximate charge neutrality.

When such inorganic oxides are used, the electron donors, electron acceptors and, optionally the donor-acceptor complexes must be capable of withstanding cure temperatures exceeding 200° C. Examples of such inorganic oxides include, but are not limited to, lead zirconate titanate (PZT), ferroelectric metal and mixed inorganic oxides with dielectric constants in amounts of 9 to 5500 such as barium strontium titanate (BST), lead lanthanum zirconate titanate (PLZT), bismuth strontium tantalite, bismuth strontium niobate lead nickel niobate, lead magnesium niobate and the like. It should be understood that the latter generic compound names are indicative of a range of stoichiometries. For example, bismuth strontium tantalite can have stoichiometries such as $Bi_2SrTa_2O_9$, $BiSr_2Ta_2O_9$. $Bi_2SrTa_2O_8$ and so on. Inorganic oxides include tantalum oxide, niobium oxide, vanadium oxide, hafnium oxide, zirconium oxide, titanium oxide, dysprosium oxide, yttrium oxide or the like or combinations comprising at least one of the foregoing. The inorganic oxides offer a wide range of dielectric constants in amounts of 8 to 1470.

Inorganic oxides may be converted into electric field programmable films via sol-gel and chemical vapor deposition (CVD) techniques. When sol-gel techniques are used to from the electric field programmable film, electron donors, electron acceptors and, optionally the donor-acceptor complexes can be co-deposited.

Electron donors and acceptors can be dispersed randomly within the matrix material or agglomerated such that electronic conduction results, at least in part from percolative transport. An electron donor is a moiety capable of donating an electron to an electron acceptor. An electron acceptor is a moiety capable of accepting an electron from an electron donor. The proposed mechanism for device operation can be better understood with respect to the following reaction schemes shown in Table 1:

TABLE 1

| Scheme | Reaction | Event |
| --- | --- | --- |
| 1 | $D + A \xrightarrow{\text{Zero bias}} X \to D^+ + A^-$ | Low conductivity state. Kinetically stable because of high barrier to electron transport. |
| 2 | $D + A \xrightarrow[\text{Suprathreshold voltage}]{\text{Forward bias}} D^+ + A^-$ | High conductivity "on" state programmed. |
| 3 | $D^+ + A^- \xleftarrow{\text{Zero bias}} D + A$ | High conductivity state in thermodynamically stable equilibrium. |
| 4 | $A^- + A \xrightarrow[\text{Subthreshold voltage}]{\text{Forward bias}} A + A^-$ | High Conductivity state. Mobile electrons move from ionized to non-ionized acceptors in the general direction of the anode. |
| 5 | $D^+ + D \xrightarrow[\text{Subthreshold voltage}]{\text{Forward bias}} D + D^+$ | High Conductivity state. Mobile "holes" move from ionized to non-ionized donors in the general direction of the cathode. |
| 6 | $D^+ + A^- \xrightarrow[\text{Suprathreshold Voltage}]{\text{Reverse bias}} D + A$ | Low conductivity "off" state programmed. |

In the schemes in Table 1, D and A represent electron donors and electron acceptors, respectively. $D^+$ and $A^-$ represent a donor moiety having lost an electron and an acceptor moiety having gained an electron, respectively. With reference to Table 1, a suprathreshold voltage in forward bias drives the device from a low conductivity "off" state to a high conductivity "on" state; a subthreshold voltage in forward bias causes the device to exhibit a high conductivity in the "on" state and a low conductivity in the "off" state; a subthreshold voltage in reverse bias causes the device to exhibit a high conductivity in the "on" state and a low conductivity in the "off" state; and a suprathreshold voltage in reverse bias drives the device from a high conductivity "on" state to a low conductivity "off" state. Devices capable of assuming either of two stable states, for example, a high conductivity state and a low conductivity state are generally called bistable devices. In one example, forward bias voltages for converting devices having electric field programmable films from the low current state to the high current state are 0.1 to 15 V. In another example, voltages of 0.1 to 10 V are used. In one example, reverse bias voltages for converting devices having field programmable films from the high current state to the low current state are −0.1 to 15 V. In another example, voltages of −0.1 to −10 V are used.

Electron donors may be organic electron donors or inorganic electron donors. Examples of organic electron donors include, but are not limited to tetrathiafulvalene, 4,4',5-trimethyltetrathiafulvalene, bis(ethylenedithio)tetrathiafulvalene, p-phenylenediamine, N-ethylcarbazole, tetrathiotetracene, hexamethylbenzene, tetramethyltetraselenofulvalene, hexamethylenetetraselenofulvalene, or the like, or combinations comprising at least one of the foregoing.

The organic electron donors are 1 to 100 nanometers (nm) in size and are prevented from aggregating by protective organic or inorganic shells. Within this range, it is generally desirable to have organic electron donors greater than or equal to 2, greater than or equal to 3, and greater than or equal to 5 nm. Also desirable, within this range, it is generally desirable to have organic electron donors less than or equal to 90, less than or equal to 75, and less than or equal to 60 nm.

The protective shells usually render the organic electron donors soluble or dispersible in a selection of suitable solvents. The thickness of the protective shell depends on the particular moiety as well as on the solvents and solutes in the solution. The protective shells for organic electron donors are about 1 to about 10 nm in thickness. Within this range, it is generally desirable to have a protective shell of greater than or equal to 1.5, and greater than or equal to 2 nm. Also desirable, within this range, it is generally desirable to a protective shell of less than or equal to 9, less than or equal to 8, and less than or equal to 6 nm.

Examples of inorganic electron donors include, but are not limited to metal-halide salts, such as titanium tetrabromide ($TiBr_4$), zirconium tetrabromide ($ZrBr_4$), vanadium tribromide ($VBr_3$), niobium tetrachloride ($NbCl_4$) or manganese dibromide ($MnBr_2$) reduced by potassium triethylborohydride ($K^+BEt_3H^-$) or tetraalkylammonium triethylborohydride($NP4^+BEt_3H^-$) (wherein R is an alkyl having 6 to 20 carbon atoms) in tetrahydrofuran (THF) for 3 to 6 hours to yield metal clusters stabilized by THF molecules.

Tetrahydrothiophene may also be used in place of THF to stabilize manganese (Mn), palladium (Pd) and platinum (Pt) containing electron donors. These inorganic electron donors are made by reducing the metal salts such as manganese bromide ($MnBr_2$), platinum chloride ($PtCl_2$) and palladium chloride ($PdCl_2$) with potassium triethylvborohydride ($K^+BEt_3H^-$) or tetraalkylammonium borohydride ($NR4^+ BEt_3H^-$) (wherein R is an alkyl having 6 to 20 carbon atoms) in the presence of tetrahydrothiophene.

In one embodiment, inorganic electron donors are derived from the halide salts or halide complexes of transition metals such as iron (Fe), cobalt (Co), nickel (Ni), copper (Cu), ruthenium (Ru), rhodium (Rh), palladium (Pd), silver (Ag), rhenium (Re), osmium (Os), iridium (Ir), platinum (Pt) and gold (Au) by reduction with $K^+ BEt_3H^-$ or $NR4^+ BEt_3H^-$ (wherein R is an alkyl having 6 to 20 carbon atoms). These nanoparticles are stabilized by using quaternary ammonium salts of the formula

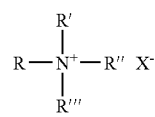

wherein R, R', R", R'" may be the same or different and are hydrogen, an alkyl having 6 to 20 carbon atoms, an aryl having 6 to 20 carbon atoms, an arylalkyl having 6 to 20 carbon atoms. Betaine surfactants may also be used as stabilizers.

In another embodiment, inorganic electron donors are derived from transition metals such as Fe, Co, Ni, Cu, Ru, Rh, Pd, Ag, Re, Os, Ir, Pt and Au by stabilizing their halide salts, halide complexes or their acetylacetonate (acac) complexes using carboxylate salts of the type $NR4^+ R'COO^-$, wherein R is an alkyl having 6 to 20 carbon atoms, and R' is hydrogen, an alkyl, an aryl or an arylalkyl having 6 to 20 carbon atoms. In yet another embodiment, mixed metal inorganic electron donors may be obtained from mixtures of transition metal halide salts, their halide complexes and their acac complexes. In yet another embodiment, electrochemical reduction of the halide salts, halide complexes or the acac complexes of Fe, Co, Ni, Cu, Ru, Rh, Pd, Ag, Re, Os, Ir, Pt and Au are also used to prepare inorganic electron donors using a variety of stabilizers such as THF, tetrahydrothiophene, quaternary ammonium salts and betaine surfactants.

The inorganic electron donors generally have particle sizes of 1 to 100 mm. Within this range, it is generally desirable to have inorganic electron donors greater than or equal to 1.5, greater than or equal to 2 nm. Also desirable, within this range, it is generally desirable to have organic electron donors less than or equal to 50, less than or equal to 25, and less than or equal to 15 nm.

Without being limited by theory, the choice of stabilizer has an effect on the electrical properties of the device because different stabilizers exhibit different dielectric constants. The dielectric constant of the stabilizing material surrounding the metal influences the self capacitance of the nanoparticles in the matrix material. For example, the self-capacitance of a naked conducting sphere in a dielectric matrix with dielectric constant κ is $$C_{sphere} = 4\pi \in_0 \kappa \gamma$$

where r is the radius of the sphere and $\in_0$ is the permittivity of free space. On the other hand, the self-capacitance of a conducting sphere with a stabilizer coating having dielectric permittivity, $\in_c$, in a matrix with dielectric permittivity $\in_m$, ∩ and a relative permittivity $\in_r = \in_m / \in_c$ is $$C_{coated-sphere} = \frac{4\pi \varepsilon_m \varepsilon_r ab}{b - a(1 - \varepsilon_r)}$$

where a is the radius of the metal sphere and b is the radius of the metal sphere plus the coating. This can amount to a 20% to 30% difference in capacitance for particles having a size of less than or equal to 10 nm with protective shells having a thickness of 1 to 2 nm and, for example, dielectric constants of 2 and 5 for the coating and the matrix, respectively.

The electron donors are generally present in the electric field programmable film in an amount of 0.05 to 45 wt % based on the total weight of the film. Within this range it is generally desirable to use an amount of for example, greater than or equal to about 3, greater than or equal to about 5, and greater than or equal to about 8 wt %, based on the total weight of the film. Also desirable within this range is an amount of less than or equal to about 40, less than or equal to about 30, and less than or equal to about 25 wt %, based on the total weight of the film.

Electron acceptors include, but are not limited to 8-hydroxyquinoline, phenothiazine, 9,10-dimethylanthracene, pentafluoroaniline, phthalocyanine, perfluorophthalicyanine, tetraphenylporphine, copper phthalocyanine, copper perfluorophthalocyanine, copper tetraphenyl porphine, 2-(9-dicyanomethylene-spiro[5.5]undec-3-ylidene)-malononitrile, 4-phenylazo-benzene-1,3-diol, 4-(pyridin-2-ylazo)-benzene-1,3-diol, benzo[1,2,5]thiadiazole-4,7-dicarbonitrile, tetracyanoquinodimethane, quinoline, chlorpromazine, tetraphenylporphine, copper phthalocyanine, copper perfluorophthalocyanine, or the like, or combinations comprising at least one of the foregoing electron acceptors.

The selection of the optimum electron acceptor is influenced by its electron affinity. It is possible to use one or more electron acceptors to minimize threshold voltages while offering improved environmental stability.

The electron acceptors are generally present in the electric field programmable film in an amount of 0.05 to 45 wt %, based on the total weight of the film. Within this range it is generally desirable to use an amount of for example, greater than or equal to about 3, greater than or equal to about 5, and greater than or equal to about 8 wt %, based on the total weight of the film. Also desirable within this range is an amount of less than or equal to about 40, less than or equal to about 30, and less than or equal to about 25 wt %, based on the total weight of the film.

When electron donors and electron acceptors are to be combined in the same formulation, it is believed that some donors and acceptors will react to form donor-acceptor complexes or, alternatively, charge-transfer salts. The extent of reaction depends on the electron affinity of the electron donor, the ionization potential of the acceptor, kinetic factors such as activation energies, activation entropies and activation volumes, and energies attributable to matrix effects. In addition to forming spontaneously as a result of a reaction between electron donors and electron acceptors, donor-acceptor complexes can be optionally added to the formulation to adjust "on" and "off" threshold voltages, "on" state currents, "off" state currents and the like.

A wide array of donor-acceptor complexes may be used. Such complexes include, but are not limited to, tetrathiafulvalene-tetracyanoquinodimethane; hexamethylenetetrathiafulvalene-tetracyanoquinodimethane; tetraselenafulvalene-tetracyanoquinodimethane; hexamethylenetetraselenafulvalene-tetracyanoquinodimethane; methylcarbazole-tetracyanoquinodimethane; tetramethyltetraselenofulvalen-tetracyanoquinodimethane; metal nanoparticle-tetracyanoquinodimethane complexes comprising gold, copper, silver or iron, ferrocene-tetracyanoquinodimethane complexes; tetrathiotetracene, tetramethyl-p-phenylenediamine, or hexamethylbenzene-tetracyanoquinodimethane complexes; tetrathiafulvalene, hexamethylenetetrathiafulvalene, tetraselenafulvalene, hexamethylenetetraselenafulvalene, or tetramethyltetraselenofulvalene-N-alkylcarbazole($C_1$-$C_{10}$, linear or branched) complexes; tetrathiotetracene, tetramethyl-p-phenylenediamine, or hexamethylbenzene-Buckminsterfullerene $C_{60}$ complexes; tetrathiafulvalene, hexamethylenetetrathiafulvalene, tetraselenafulvalene, hexamethylenetetraselenafulvalene, or tetramethyltetraselenofulvalene-N-alkylcarbazole($C_1$-$C_{10}$, linear or branched) complexes; tetrathiotetracene, tetramethyl-p-phenylenediamine, or hexamethylbenzene-tetracyanobenzene complexes, tetrathiafulvalene, hexamethylenetetrathiafulvalene, tetraselenafulvalene, hexamethylenetetraselenafulvalene, or tetramethyltetraselenofulvalene-N-alkylcarbazole($C_1$-$C_{10}$, linear or branched) complexes, tetrathiotetracene, tetramethyl-p-phenylenediamine, or hexamethylbenzene-tetracyanoethylene complexes; tetrathiafulvalene, hexamethylenetetrathiafulvalene, tetraselenafulvalene, hexamethylenetetraselenafulvalene, or tetramethyltetraselenofulvalene-N-alkylcarbazole($C_1$-$C_{10}$, linear or branched) complexes, tetrathiotetracene, tetramethyl-p-phenylenediamine, or hexamethylbenzene-p-chloranil complexes, or combinations comprising at least one of the foregoing donor-acceptor complexes.

When donor-acceptor complexes are used, they are generally present in the film in an amount of 0.05 to 5 wt % based on the total weight of the film. Within this range, it is generally desirable to use an amount of for example, greater than or equal to about 0.08, greater than or equal to about 0.1, and greater than or equal to about 0.5 wt %, based on the total weight of the film. Also desirable within this range is an amount of less than or equal to about 4.5, less than or equal to about 4, and less than or equal to about 3.5 wt %, based on the total weight of the film.

The solvent can be any liquid that dissolves the matrix material; the electron donors; the electron acceptors; and, optionally, and the optional donor-acceptor complexes. It is generally desirable that the matrix precursor composition or the dielectric matrix material; the electron donors; the electron acceptors; and, optionally, and the optional donor-acceptor complexes remain in solution for a sufficient period of time to allow casting of the electric field programmable film. Accordingly, solvent systems that provide kinetically stable or thermodynamically stable solutions are suitable. In general, casting solvents should have a flash point greater than or equal to 36° C. and a boiling point of 120° C. to 300° C.

Suitable solvents include, but are not limited to 1,2-dichloro-benzene, anisole, mixed xylene isomers, o-xylene, p-xylene, m-xylene, diethyl carbonate, propylene carbonate, $R^1$—CO—$R^2$, $R^1$—COO—$R^2$ and $R^1$—COO—$R^3$—COO—$R^2$ wherein $R^1$ and $R^2$ can be the same or different and represent linear, cyclic or branched alkyl alkylene, alkyne, benzyl or aryl moieties having 1 to 10 carbon atoms, and $R^3$ is a linear or branched divalent alkylene having 1 to 6 carbon atoms.

In one embodiment, the electric field programmable film composition can optionally contain a surfactant to form a colloidal suspension, emulsion or microemulsion comprising water or another suitable carrier. Suitable nonionic surfactants include alcohol ethoxylates, alkylphenol ethoxylates, and alkylpolyglycosides. It is desirable to use alcohol ethoxylates having, for example, 6 to 24 carbon atoms. It is also desirable to use alcohol ethoxylates having, for example, 1 to 20 ethylene oxide groups. Alkylphenol ethoxylates having 6 to 24 carbon atoms may also be used as surfactants. In one example, alkylphenol ethoxylates may be used as surfactants, wherein the alkylphenol moieties have 8 to 10 carbon atoms and 1 to 100 ethylene oxide groups. Within this range, it is exemplary to have 12 to 20 ethylene oxide groups. Alkylpolyglycosides having 6 to 24 carbon atoms may also be used as surfactants. Within this range, it is exemplary to use alkylpolyglycosides with 6 to 20 carbon atoms. It is also exemplary to use alkylpolyglycosides having 1 to 20 glycoside groups with 9 to 20 glycoside groups more exemplary. Ethylene oxide-propylene oxide block copolymers may also be used as surfactants.

Suitable quaternary ammonium surfactants include compounds having the formula

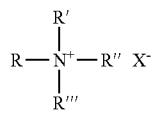

wherein R, R', R" and R'" are the same or different and may be an alkyl, aryl or aralkyl group having 1 to 24 carbon atoms that can optionally contain one or more of phosphorus, oxygen sulfur or nitrogen heteroatoms, and wherein X is F, Cl, Br, I or an alkyl sulfate.

Suitable anionic surfactants include alkylbenzene sulfonates having 6 to 24 carbon atoms; olefin sulfonates having 6 to 24 carbon atoms; paraffin sulfonates having 6 to 24 carbon atoms; cumene sulfonate; xylene sulfonate; alcohol sulfates having 6 to 24 carbon atoms; and alcohol ether sulfates having 6 to 24 carbon atoms with 1 to 20 ethylene oxide groups.

Suitable amphoteric surfactants include amine oxide compounds having the general formula

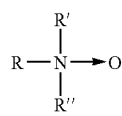

where R, R' and R" are the same or different and are each an alkyl, aryl or aralkyl group having 6 to 24 carbon atoms that can optionally contain one or more P, O, S or N heteroatoms. Another class of amphoteric surfactants includes betaine compounds having the formula:

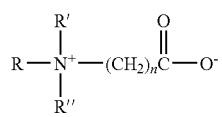

where R, R' and R" may be the same or different and are each an alkyl, aryl or aralkyl group having 6 to 24 carbon atoms that can optionally contain one or more P, O, S or N heteroatoms, and n is 1 to 10.

If the electric field programmable film composition utilized a surfactant, it is generally desirable for the electric field programmable film composition to contain less than or equal to 10 wt % surfactant, less than or equal to 3 wt % surfactant and less than or equal to 1 wt % surfactant.

In order to form the electric field programmable film, the electric field programmable film composition is cast onto a substrate and any solvent present is then removed. For spin-coating, spin speeds of 200 rpm to 6000 rpm may be used. Relative solvent evaporation rates are usually referenced to the evaporation rate of n-butyl acetate at 20° C. Desired evaporation rates for casting solvents are 0.05 to 2.0. The solvent evaporation rate for example, should be greater than or equal to 0.1. The solvent evaporation rate for example, is less than or equal to 1.0.

In manufacturing the electric field programmable film from the electric field programmable film composition, various methods of manufacturing may be employed. In one embodiment, the electric field programmable film is cast from a solvent on a suitable substrate by processes such as spin coating, spray coating, ink-jet coating, dip coating, blade coating and slot coating. In another embodiment, the electric field programmable film composition can optionally contain be electrodeposited from a colloidal suspension, emulsion or microemulsion comprising water or another suitable carrier.

Once deposited, the film can be dried using a convection oven, an infrared oven, a microwave oven, a radiant heater, a hard-contact or proximity hotplate or other suitable heating device at temperatures of 10° C. to 250° C. The time of heating is for a period of 15 seconds to 2 hours, depending on the drying method used. It is desired that the film is brought to within 10° C. of the target temperature for at least 10 seconds to 5 minutes. Whatever the method of drying, the final solvent concentration in the film is less or equal to about 10 wt %, with less than or equal to 5 wt % being exemplary, and less than or equal to 3 wt % being even more exemplary, based on the total weight of the electric field programmable film.

As stated above, the film may be used in a cross-point array. When the film is used in a cross point array, the electrodes may be electrically coupled to the electric field programmable film. The cross point array may advantageously include an electrical coupling element. An electrical coupling element is a component interposed between the electric field programmable film or electric field programmable film element. Examples of electrical coupling elements are a bit line or a word line. An electrical coupling element can provide ohmic contact, contact via a conducting plug, capacitive contact, contact via an intervening tunnel junction, contact via an intervening isolation device such as a diode or a transistor or contact via other electrical devices.

A word line is the conductor or semiconductor that selects the desired bit in a random access memory device. It is also called the select line. When the word line is asserted, the bit can either be read or written. When the device is symmetrical, the designation of "word line" or "bit line" can be arbitrary. A word line array is a plurality of word lines arranged in essentially parallel fashion. A bit line is the conductor or semiconductor that reads or writes the desired bit in a random access memory device. When the word line is asserted, the bit is selected and can be either read or written. When the device is symmetrical, the designation of "word line" or "bit line" can be arbitrary. A bit line array is a plurality of bit lines arranged in essentially parallel fashion.

The electric field programmable film obtained from the electric field programmable film composition may be used in electronic memory and switching devices or data storage devices. These devices may contain either a single film or multiple films. Devices having multiple films are generally termed stacked devices. The following figures depict a number of exemplary embodiments in which the electric field programmable film may be used. FIG. 1(b) shows one example of a cross point array having a single electric field programmable film, 2, coupled to a first electrode, 3, a second electrode, 4, a variable program/read voltage source connected to the first electrode, 5 and a reference or ground corrected to the second electrode, 6. FIG. 2(a) shows a cutaway view of a cross-point array data storage device with a continuous electric field programmable film represented by 7, an array of word lines, an example of which is 8, an array of bit lines, an example of which is 9 and the electric field programmable film element 10 formed by the interposing electric field programmable film 7 at the intersection of word line 8 and bit line 9. FIG. 2(b) shows a cutaway view of a cross-point array data storage device with a plurality of pixilated electric field programmable film elements represented by 11. Each electric field programmable film element is electrically coupled to a word line, exemplified by 12, and a bit line, exemplified by 13. In addition, there are a plurality of electrical coupling elements, exemplified by 14 interposed between the electric field programmable films and the word lines.

FIG. 3(a) shows a schematic diagram of a cross point array device comprising electric field programmable film elements, represented by 16, electrically coupled to an exemplary bit line, 17, and an exemplary word line, 18, via exemplary connections, 19 and 20, respectively. Also shown in block diagram form are the sensing electronics, 21 and the polling electronics, 22. FIG. 3(b) shows a schematic diagram of a cross point array device comprising electric field programmable film elements, an example of which is shown by 23, electrically coupled to an exemplary bit line, 24, and an exemplary word line, 25. The electric field programmable film elements are electrically coupled to their respective bit lines, exemplified by the connection at 24, via isolation diodes, an example of which is shown by 27 and further electrically coupled to their respective word lines at 28. Also shown in block diagram form are the polling electronics, 29 and the sensing electronics, 30 used to address the individual bits and amplify the signals obtained from them.

Figure 4:
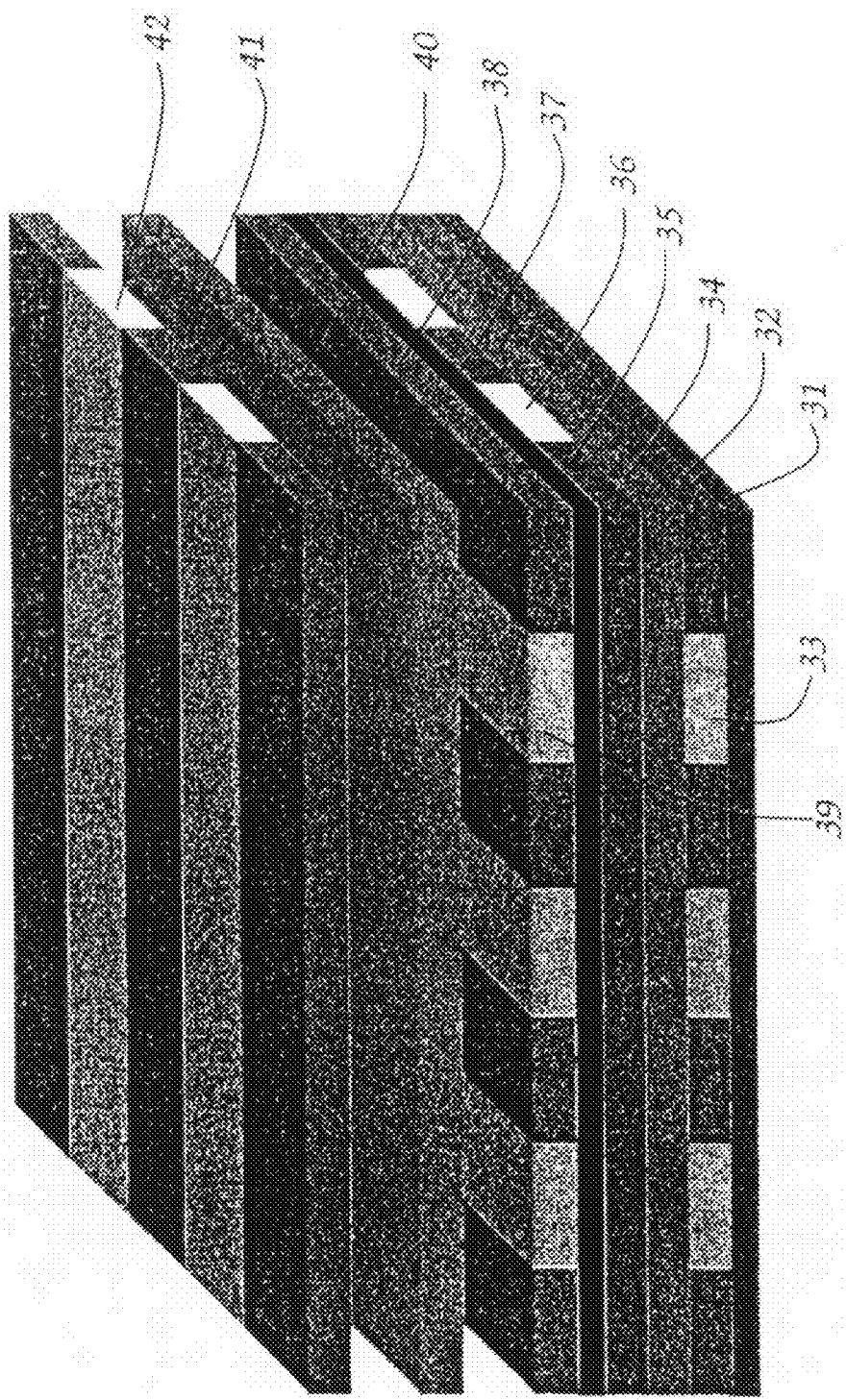
FIG. 4 shows a cutaway partially exploded view of a stacked data storage device on a substrate.

FIG. 4 shows a cutaway partially exploded view of a stacked data storage device on a substrate, 31, comprising a first device layer, having a vertical line array with a plurality of conducting or semiconducting electrodes, exemplified by 32, and an insulating material having a dielectric constant, 33, an electric field programmable film, 34, electrically coupled to the conducting or semiconducting electrodes exemplified by 32 and the conducting or semiconducting electrodes, exemplified by 35, in a horizontal line array with each electrode being isolated from its nearest neighbor by an insulating material having a dielectric constant, exemplified by 36, a second device layer, separated from the first device layer by a dielectric insulating layer, 37, having a vertical line array with a plurality of conducting or semiconducting electrodes, exemplified by 38, and an insulating material having a dielectric constant, 39, an electric field programmable film, 40, electrically coupled to the conducting or semiconducting electrodes exemplified by 38 and the conducting or semiconducting electrodes, exemplified by 41, in a horizontal line array with each electrode being isolated from its nearest neighbor by an insulating material having a dielectric constant, exemplified by 42.

In general, the horizontal lines and the vertical lines intersect each other without direct physical and electrical contact, and wherein at each prescribed intersection of a horizontal line and a vertical line, the horizontal line is electrically coupled to the first surface of the electric field programmable film element and the vertical line is electrically coupled to the second surface of the electric field programmable film element and wherein said stacked data storage device comprises a configuration selected from

[H P V D]$_{n-1}$ H P V,
[V P H D]$_{n-1}$ V P H,
[H P V P]$_m$ H, and
[V P H P]$_m$ V, where n−1 and m represent the number of repeating layers, n=1-32, m=1-16, H is a horizontal line array, V is a vertical line array, P is a set of electric field programmable film elements arrayed in essentially coplanar fashion, and D is a dielectric insulating layer.

Figure 5:
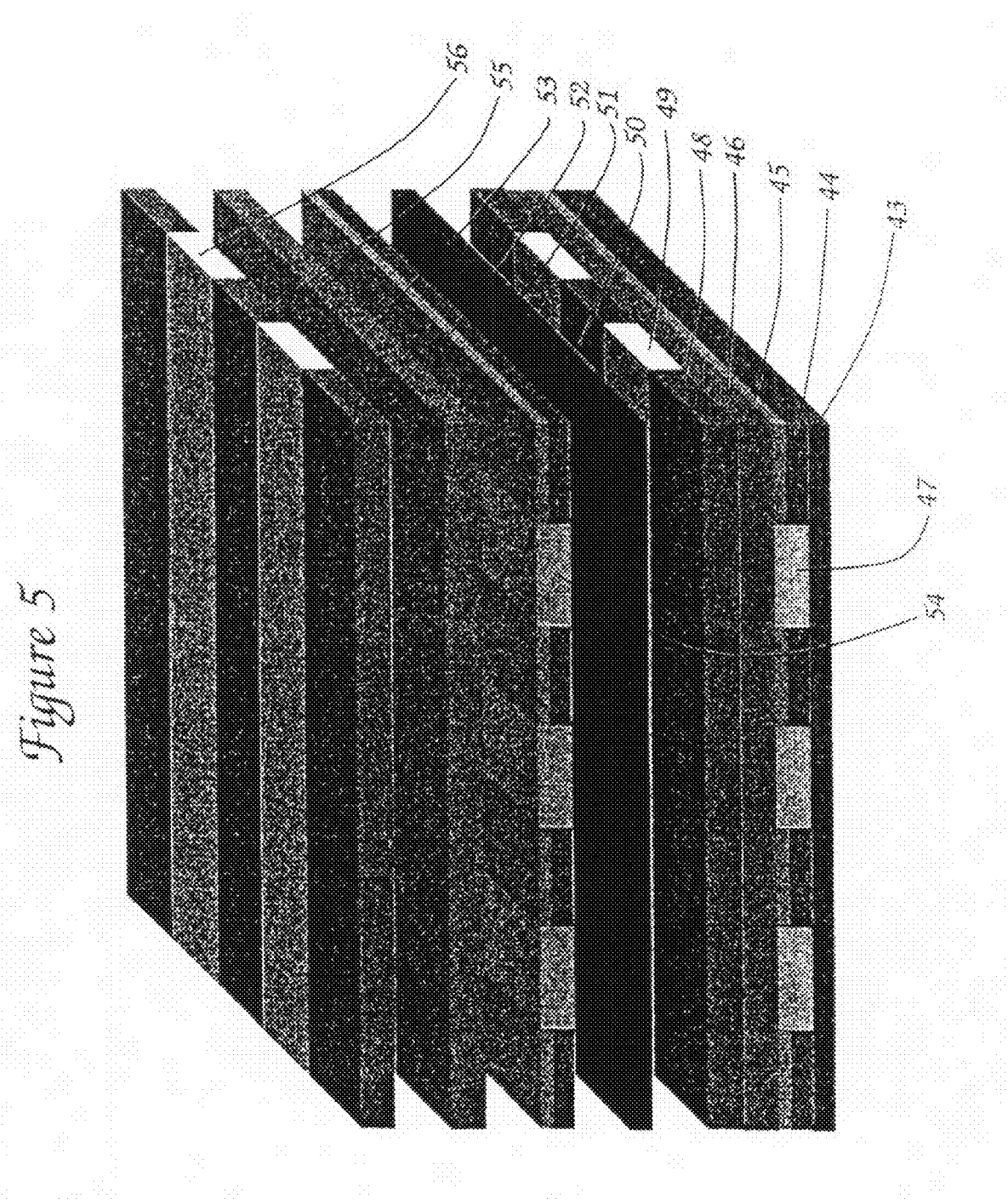
FIG. 5 shows a cutaway partially exploded view of a stacked data storage device on a substrate.
Figure 6:
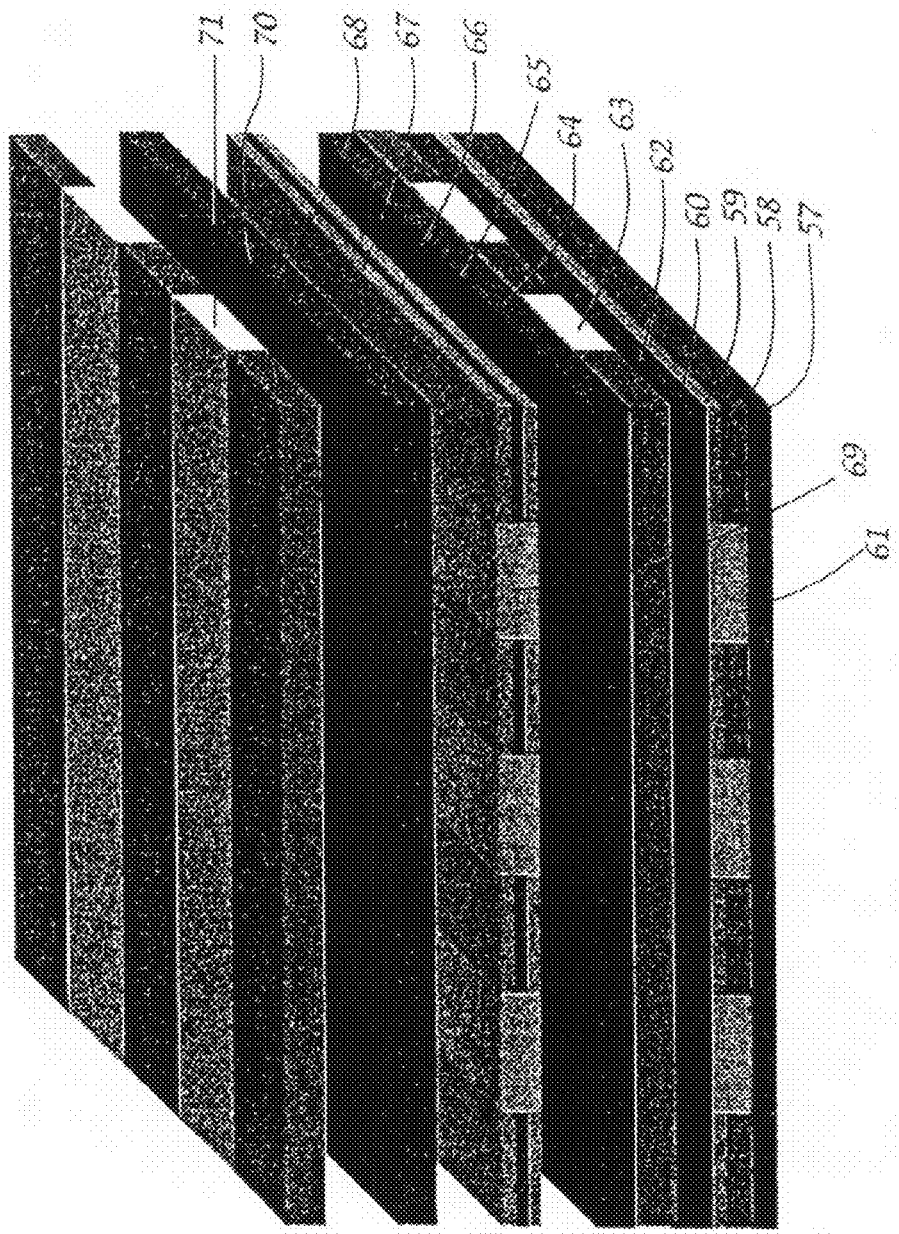
FIG. 6 is shows a partially exploded cutaway view of another stacked data storage device comprising a substrate and three device layers.

In addition to single layer memory structures described above, multi-layered structures such as those shown in FIGS. 4, 5 and 6 may also be constructed. While the figures indicate only a few device layers for simplicity, a larger number is contemplated in accordance with the appended claims.

FIGS. 4 and 5 show stacked structures separated by a dielectric isolation layer. Such layers form a substantially plane layer-like structure, making it possible to stack such planar layer-like structures, thus forming a volumetric memory device. Isolation layers of this invention are intended to isolate the various device layers from one another electrically, capacitively, and, optionally, optically. In addition, the material must be capable of being etched so that via holes can be imparted for the purpose of interconnecting the various layers. Inorganic isolation materials such as silicon oxide, formed chemical vapor deposition from the decomposition of tetraethylorthosilicate (TEOS) or other silicate, silicon nitride, silicon oxynitride, titanium dioxide, and the like are used for this purpose. In addition, organic and organosilicon isolation materials such as spin-on glass formulations comprising siloxanes having $C_1$-$C_{10}$ alkane substitution, substituted silsesquioxanes having $C_1$-$C_{20}$ alkyl, aryl or alkylaryl substitution, fluoropolymers comprising tetrafluoroethylene, polyimides, and the like.

Isolation of individual bits along, for example, a word line is accomplished using contact diode structures of the kind described and shown in FIG. 5. Stacked devices in which electrodes are shared between device layers are exemplified in FIG. 6. These stacked devices are distinguished in that they do not use isolation layers. Instead, the word-line is shared between adjacent field programmable film layers.

FIG. 5 shows a cutaway partially exploded view of a stacked data storage device having a substrate, 43, a first device layer and a second device layer. The first device layer comprises a vertical line array having conducting or semiconducting lines, exemplified by 44, in contact with a conducting or semiconducting material, exemplified by 45, having a different work function than 44 thus forming a contact diode, and insulators having a dielectric constant, exemplified by 47, an electric field programmable film, 46, and a horizontal line array comprising conducting or semiconducting lines, exemplified by 48 and insulators having a dielectric constant, exemplified by 49. The diode comprises an anode comprising a metal having a work function between 2.7 and 4.9 eV and a conducting polymer having a work function greater than 4.5 eV. Portions of the bottom surface of 46 are electrically coupled to the lines, 44 via the contact diodes formed by 44 and 45. Portions of the top surface of 46 are electrically coupled to the lines, 48.

The semiconducting lines generally comprises a material selected from p-doped silicon, n-doped silicon, p-doped amorphous silicon, n-doped amorphous silicon, p-doped polycrystalline silicon, n-doped polycrystalline silicon, tantalum silicide, titanium silicide, tungsten silicide, vanadium silicide, polyacetylene, polypyrrole, polyaniline, polythiophene, poly(3,4-ethylenedioxythiophene), PEDOT-PSS, poly(para-phenylene), poly(pyridine), polyfuran, polyfluorene, polyphenylenevinylene, polyselenophene, poly(peri-naphthalene), polyazulene, polycarbozole, polyindole, polypyrene, poly(p-phenylene sulfide), polyphenylene oxide, polyquinoline, polyacenaphthylenediyl, polyisothianaphthene, polynaphthothiophene, poly(p-hydro-quinone-alt-thiophene) or poly(furan-co-phenylene).

FIG. 5 further shows, in cutaway form, a second device layer, isolated from the first device layer by an isolating film, 50; having a dielectric constant. The second device layer comprises a vertical line array having conducting or semiconducting lines, exemplified by 51, in contact with a conducting or semiconducting material, exemplified by 52, having a different work function than 51 thus forming a contact diode, and insulators having a dielectric constant, exemplified by 54, an electric field programmable film, 53, and a horizontal line array comprising conducting or semiconducting lines, exemplified by 55 and insulators having a dielectric constant, exemplified by 56. Portions of the bottom surface of 53 are electrically coupled to the lines, 51 via the contact diodes formed by 51 and 52. Portions of the top surface of 46 are electrically coupled to the lines, 55. The first and second device layers in FIG. 5 are shown aligned with one another but can be offset to facilitate interconnection.

In FIG. 6 is provided a partially exploded cutaway view of yet another stacked data storage device comprising a substrate, 57, and three device layers. The first device layer comprises a vertical line array having conducting or semiconducting lines, exemplified by 58, in contact with a conducting or semiconducting material, exemplified by 59, having a different work function than 58 thus forming a contact diode, and insulators having a dielectric constant, exemplified by 61, an electric field programmable film, 60, and a horizontal line array comprising conducting or semiconducting lines, exemplified by 62 and insulators having a dielectric constant, exemplified by 63. Portions of the bottom surface of 60 are electrically coupled to the lines, 58 via the contact diodes formed by 58 and 59. Portions of the top surface of 60 are electrically coupled to the bottom sides of the lines, 62.

The second device layer in FIG. 6 comprises the same horizontal line array as the first device layer, having conducting or semiconducting lines, exemplified by 62, and insulators having a dielectric constant, exemplified by 63, an electric field programmable film, 64, and a vertical line array comprising conducting or semiconducting lines, exemplified by 66, in contact with a conducting or semiconducting material, exemplified by 65, having a different work function than 66, thus forming a contact diode, and insulators having a dielectric constant, exemplified by 69. Portions of the bottom surface of 64 are electrically coupled to the top surfaces of the lines, 62. Portions of the top surface of 64 are electrically coupled to the lines, 66 via the contact diodes formed by 65 and 66. The horizontal line array, comprising the conducting or semiconducting lines, 62 and insulators, 63, is shared by the first and second device layers.

The third device layer in FIG. 6 comprises a vertical line array having conducting or semi-conducting lines, exemplified by 66, in contact with a conducting or semiconducting material, exemplified by 67, having a different work function than 66 thus forming a contact diode, and insulators having a dielectric constant, exemplified by 69, an electric field programmable film, 68, and a horizontal line array comprising conducting or semiconducting lines, exemplified by 70 and insulators having a dielectric constant, exemplified by 71. Portions of the bottom surface of 68 are electrically coupled to the lines, 66 via the contact diodes formed by 66 and 67. The third device layer in FIG. 6 shares the electrodes exemplified by 66 with the second device layer via 67. Portions of the top surface of 68 are electrically coupled to the bottom sides of the lines, 70.

Figure 7:
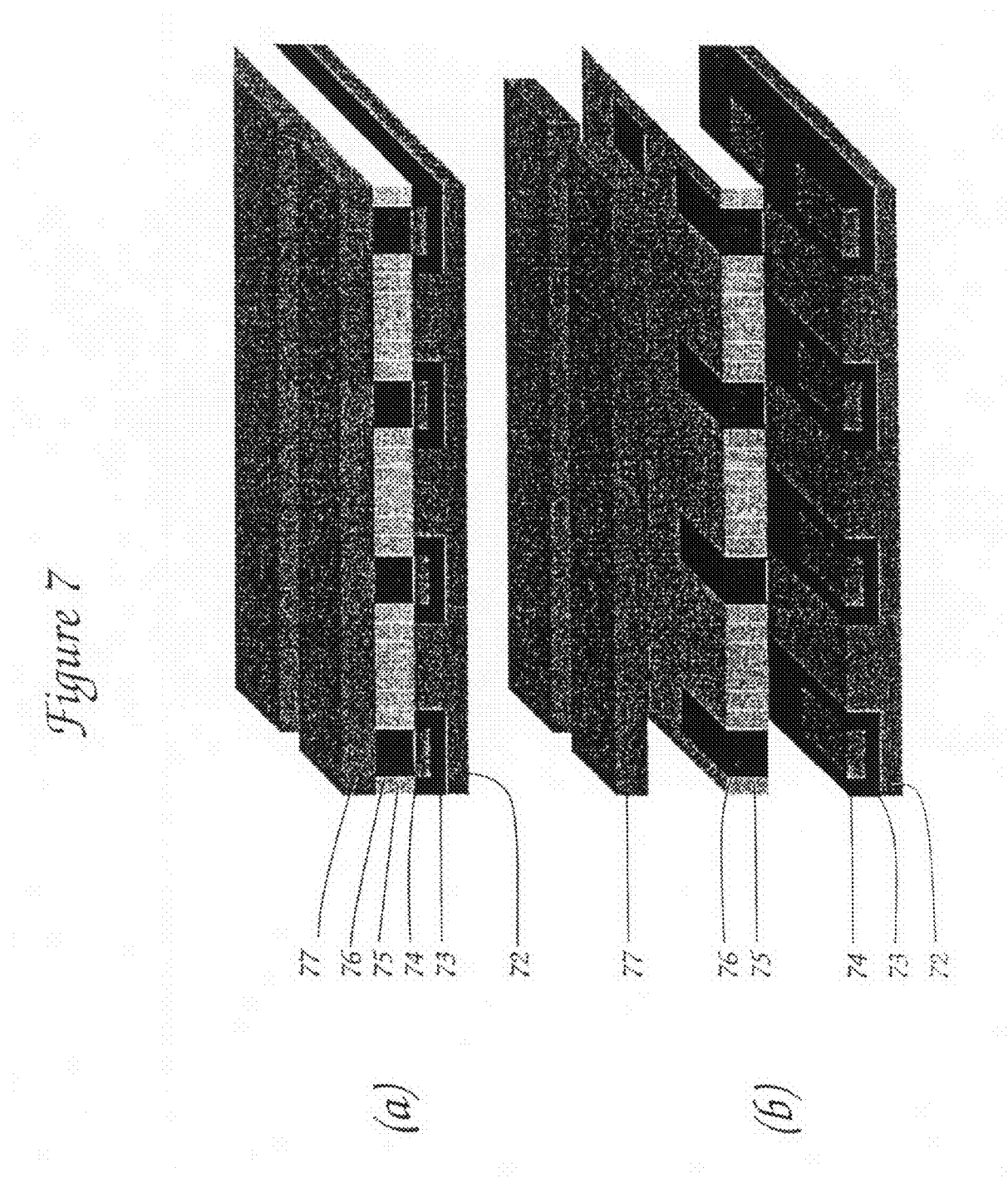
FIG. 7 provides, in a cutaway, contiguous, 7(a), and exploded, 7(b), views of, a portion of a data storage device in which the memory elements are isolated by junction diodes.

FIG. 7 provides, in cutaway, contiguous, 7(*a*), and exploded, 7(*b*), views of a portion of a data storage device in which the memory elements are isolated by junction diodes. A p-type semiconductor, 72, is used as the substrate, with a vertical n+ bit line array, exemplified by 73, a plurality of p+ zones doped within each bit line, exemplified by 74, a patterned matrix for isolating the electric field programmable film elements, 75, electric field programmable film elements, exemplified by 76, and conducting or semiconducting word lines, 77, each in contact with a row of electric field programmable film elements. The p+ regions, 74, and the n+ bit lines, 73, form an array of isolation diodes, which electrically isolate the intended bits for reading, writing and addressing.

Figure 2:
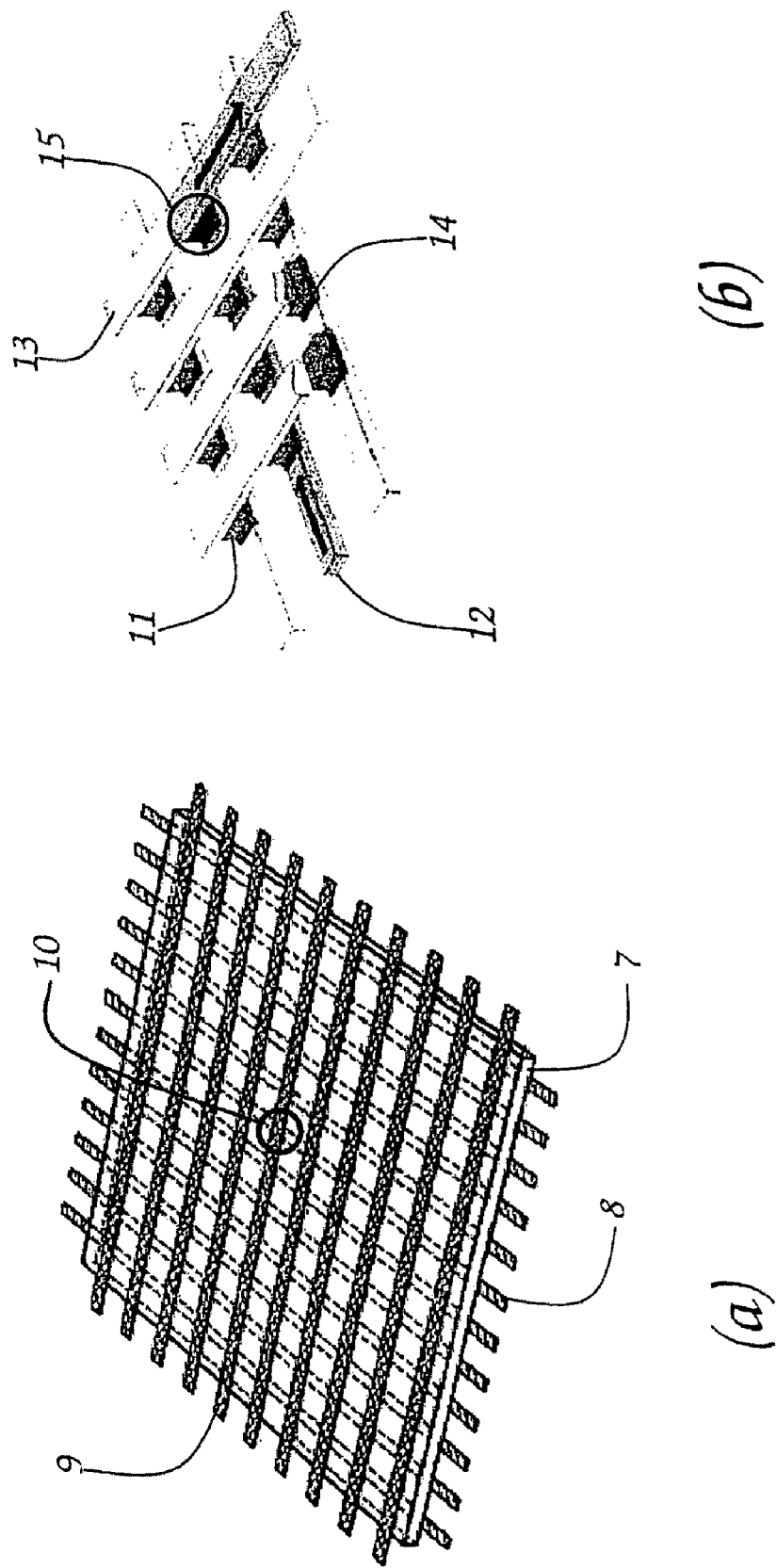
FIG. 2(a) shows a cutaway view of a cross-point array data storage device with a continuous electric field programmable film.
FIG. 2(b) shows a cutaway view of a cross-point array data storage device with a plurality of pixilated electric field programmable film elements.
Figure 3:
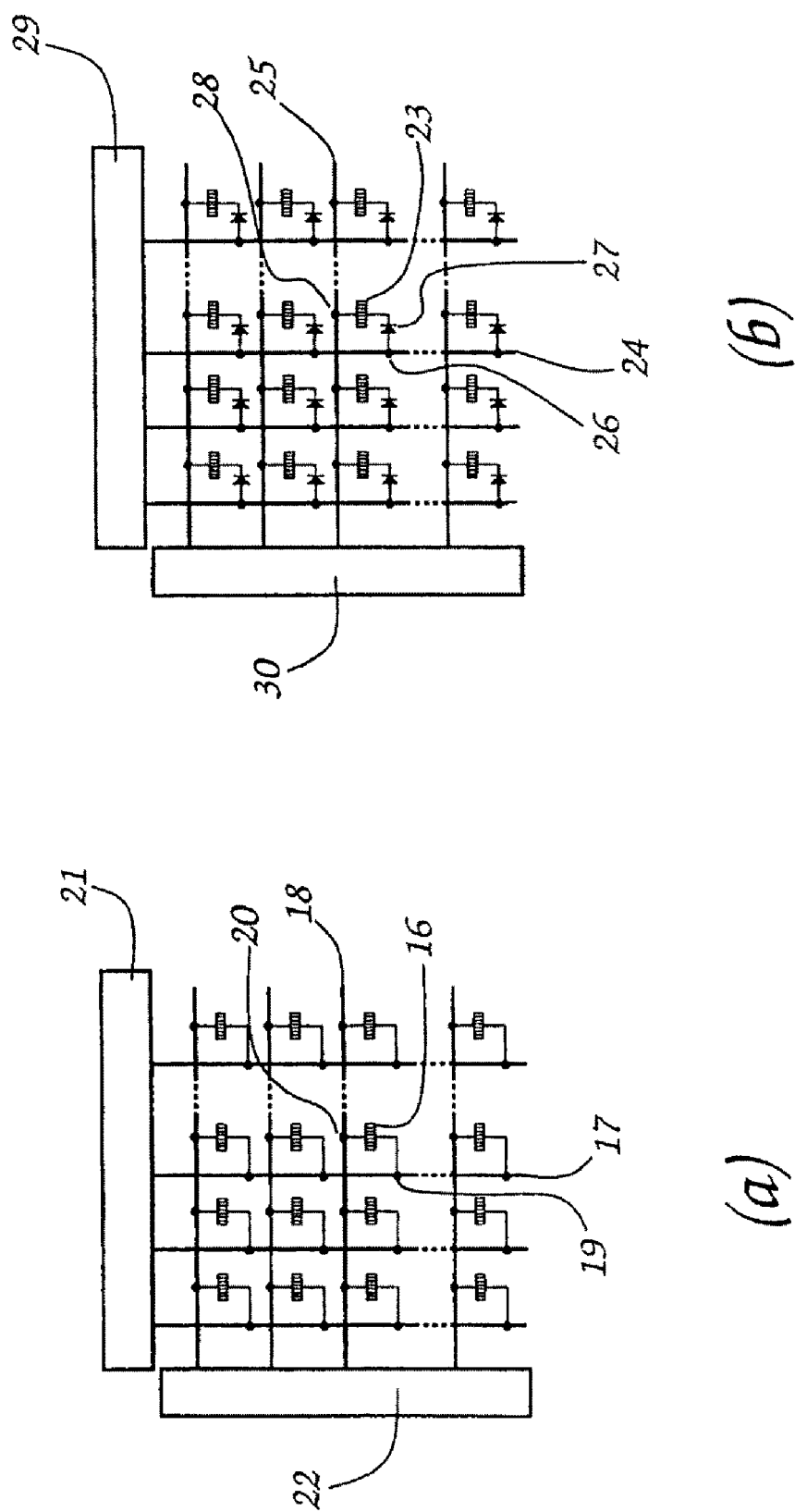
FIG. 3(a) shows a schematic diagram of a cross point array device comprising electric field programmable film elements.
FIG. 3(b) shows a schematic diagram of a cross point array device comprising electric field programmable film elements.

Addressing an individual bit in a cross-point array such as those in FIGS. 2 and 3 requires isolation of the selected bit from the contiguous bits as well as the bits along the same word line. In general, this isolation is effected by introducing an asymmetry in the "on" and "off" threshold voltages for the device where the magnitudes of the "on" and "off" threshold voltages differ significantly.

One method of producing such an asymmetry is by forming a inorganic oxide on one of the electrodes prior to the deposition of the electric field programmable film. This can be accomplished by allowing the metal of the electrode to form a native oxide in air or, more actively, by oxidizing the metal electrode in ozone. In this way, the two electrode surfaces are electrically coupled to the electric field programmable film in different ways; one is electrically coupled via capacitive coupling while the other is in direct contact. The oxide coating on the electrode must be sufficiently thin to enable charge injection into the electric field programmable film via tunneling, hot carrier injection or electron hopping. For example, aluminum oxide, thicknesses of 0.5 to 3.0 nm are used.

Another method of producing such an asymmetry is by using metals with differing work functions. The work function is defined as that energy required to remove an electron from the surface of the metal to infinity. While different crystal faces of metals and other elements exhibit different work functions, the electrodes used on the electric field programmable films are polycrystalline. Accordingly, the work function comprises an average of the crystalline forms in contact with the electric field programmable film. By way of example, consider an electric field programmable film in contact with an aluminum electrode on one side ($\Phi$~4.2 electron-volts (eV)) and a nickel electrode on the other ($\Phi$~5.2 eV). If the forward bias is defined as proceeding from the aluminum electrode to the nickel electrode, with the aluminum electrode being the anode, the magnitude of the forward bias voltage required to initiate the "on" state will be higher than the magnitude of the reverse bias voltage required to impose the "off" state. Among the transition elements, Al, Cr, Fe, Re, Ru, Ta, Ti), V, W and Zr all exhibit work functions less than 5 eV, Rh exhibits a work function of approximately 5 eV and Au, Cu, Ir, Ni, Pd, and Pt exhibit work functions greater than 5 eV.

Still another way to impose asymmetry on devices comprising field programmable films is to introduce contact diodes using organic conductors and semiconductors. Such diodes are described in L. S. Roman and O. Inganäs, Synthetic Metals, 125, (2002), 419 and can be further understood by making reference to FIGS. 2(b) and 5. In brief, these diodes comprise a low work function conducting polymer such as poly(3-(2'-methoxy-5'-octylphenyl)thiophene) (POMeOPT) ($\Phi$~3 eV) in contact on one side with an Al electrode ($\Phi$~4.2 eV) and on the other side with poly(3,4-ethylenedioxythiophene) doped with poly(4-styrenesulfonate) (PEDOT-PSS) ($\Phi$~5.2 eV), which, in turn, is in contact with an aluminum electrode. In the device POMeOPT is interposed between the electric field programmable film and the metal electrode. Aluminum or some other metal having a similar work function electrode such as copper <110> ($\Phi$~4.5 eV) is applied to the opposite side of the electric field programmable film. Other organic conductors and semiconductors that are used in this invention are doped polyaniline, doped polypyrrole, polythiophene, and polyphenylene vinylene. In addition, one can use indium-tin-oxide (ITO) to introduce an asymmetry in the "on" and "off" voltages in like manner to the above examples.

Still another way to introduce an asymmetry in the "on" and "off" voltages is to place the device in contact with a semiconductor diode of the kind shown in FIG. 7. Yet another way to isolate the "on" and "off" voltages is to place the device in electrical contact with a field effect isolation transistor. This can be effected such that the field programmable film is electrically coupled to the source or the drain of the transistor either via a metal "plug" electrode or directly, such that the device can only be probed or programmed when the gate in an "open" condition.

Some embodiments of the invention will now be described in detail in the following Examples. In the formulation examples all weight percents are based on the total weight of the electric field programmable film composition unless otherwise expressed.

EXAMPLE 1

Gold nanoparticles were synthesized at room temperature using a two-phase arrested growth method detailed by M. J. Hostetler, et. al., Langmuir, 14 (1998) 17). 50 milliliter (ml) aqueous solution of 0.62 grams (g) HAuCl4.3H2O (2 equiv) was added into 80 ml toluene solution of 3.0 g of tetraoctylammonium bromide (5 equiv). The mixture was vigorously stirred for 1 hour. The organic phase was collected and 0.4 ml dodecanethiol was added to the reaction mixture. The resulting solution was stirred for 10 minutes (min) at room temperature. The solution was then stirred vigorously and 50 ml aqueous solution of NaBH4 (0.76 g, 20 equiv) was added over a period of 15 min. The mixture was further stirred at room temperature for 1 hour (h). The organic phase was then collected, and the gold nanoparticles were precipitated by adding 400 ml methanol. The black precipitate was separated from the solution. 20 ml tetrahydrofuran was used to dissolve the black precipitate and another 200 ml methanol to re-precipitate the gold nanoparticles. This dissolving (in tetrahydrofuran) and precipitating (with methanol) process was repeated three times to remove the phase-transfer catalyst, excess thiol, and by-products. The metal nanoparticles were dried in air or in vacuo.

EXAMPLE 2

Gold nanoparticles were prepared by the same process as Example 1 except that 0.6 ml dodecanethiol was added during the chemical reaction.

EXAMPLE 3

Gold nanoparticles were prepared by the same process as Example 1 except that 0.8 ml dodecanethiol was added during the chemical reaction.

EXAMPLE 4

Silver nanoparticles were synthesized at room temperature using a two-phase arrested growth method detailed by B. A. Korgel, S. Fullam, S. Connolly, and D. Fitzmaurice, J. Phys. Chem. B, 102 (1998) 8379. 30 ml aqueous solution of silver nitrate (0.31 g) was added into 140 ml toluene solution of phase transfer catalyst (3.2 grams (C8H17)4NBr) and stirred vigorously for 1 hour. The organic phase was subsequently collected and 0.4 ml dodecanethiol was added. After the dodecanethiol/Ag+ solution was stirred for 15 min, 90 ml of an aqueous solution of sodium borohydride (0.85 g NaBH4) solution was added dropwise over 20 minutes. The reaction mixture was stirred for 12 hours before the organic/nanocrystal-rich phase was collected. 400 ml methanol was added into the organic phase to precipitate the silver nanoparticles and the silver nanoparticles were washed with methanol three times. The silver nanoparticles were dried in vacuum and stored in nitrogen atmosphere to avoid oxidation by oxygen in air.

EXAMPLE 5

The bottom Al electrodes with the width of 0.2 millimeter (mm) and the thickness of 50 nm were deposited on glass substrates by thermal evaporation. The electric field programmable film was formed by spin-coating 1,2-dichlorobenzene (DCB) solution of 1.2% polystyrene (PS) (as matrix), 0.4% dodecanethiol-protected Au nanoparticles (Au NP by Example 1) and 0.4% 8-hydroxyquinoline (8HQ) (as electron acceptor). The film was then baked at 80° C. for 30 minutes. The device was completed by thermally depositing the top Al electrodes of 50 nm thickness and 0.2 mm width at a vacuum of $1 \times 10^{-5}$ Torr. The junction area of the top and bottom electrodes was $0.2 \times 0.2$ mm$^2$. Such devices are represented by the nomenclature "Al/PS+Au NP+8HQ/Al". The I-V curve was tested in air using an HP 4155B semiconductor parameter analyzer. The device exhibited very low current (1.7 nano ampere (nA) at 1.5V) during the first scan below the electrical "on" threshold. A transition took place at approximately 3V. The current jumped more than three orders of magnitude. The device was stable at the high conductivity state (curve b) with a current of 2.2 microamperes (μA) at 1.5V ("on" state). The device was returned to the OFF state by applying a negative voltage (−2.5V). It was determined that the device could return to the "ON" state again under positive bias above approximately 3V. Hence, the device was stable in both the ON and OFF states and can be switched between these two states by simply applying electrical bias.

EXAMPLES 6-13

The devices in example 6 to 13 were fabricated by a process similar to that in example 5 with different materials as the electrode, matrix, nanoparticles and electron acceptors. The solution for the electric field programmable film contained 1.2% polymer, 0.4% nanoparticle and 0.4% electron acceptor in 1,2-dichlorobenzene. The materials and selected performance parameters were listed in the following Tables 2, 3 and 4. (Vth: the threshold voltage at which the "on" transition takes place, $I_{OFF}$ and $I_{ON}$ are the currents in the low and high conductivity states, respectively).

TABLE 2

| | Example | | |
| --- | --- | --- | --- |
| | 6 | 7 | 8 |
| Electrode 1 | Al | Al | Al |
| Matrix | PS | PS | PS |
| Nanoparticles | Example 4 | Example 3 | Example 2 |
| Electron acceptor | 8HQ | 8HQ | 9,10-dimethyl-anthracene |
| Electrode 2 | Al | Al | Al |
| $V_{th}$ (V) | 3.0 | 2.7 | 6.1 |
| $I_{OFF}$ @½ $V_{th}$ (nA) | 1.73 | 0.4 | 0.5 |
| $I_{ON}$ @½ $V_{th}$ (nA) | 23,230 | 1,000 | 1,728 |

TABLE 3

| | Example | | |
| --- | --- | --- | --- |
| | 9 | 10 | 11 |
| Electrode 1 | Al | Al | Al |
| Matrix | PS | PS | PS |
| Nanoparticles | Example 2 | Example 2 | Example 2 |
| Electron acceptor | Pentafluoro-aniline | 29H,31H-phthalocyanine | Copper (II) phthalocyanine |
| Electrode 2 | Al | Al | Al |
| $V_{th}$ (V) | 6.9 | 4.6 | 5.3 |
| $I_{OFF}$ @½ $V_{th}$ (nA) | 0.7 | 1.1 | 1.6 |
| $I_{ON}$ @½ $V_{th}$ (nA) | 1,075 | 1,728 | 2,334 |

TABLE 4

| | Example | |
| --- | --- | --- |
| | 12 | 13 |
| Electrode 1 | Al | Al |
| Matrix | PMMA | PMMA |
| Nanoparticle | Example 1 | Example 4 |
| Electron acceptor | 8HQ | 8HQ |
| Electrode 2 | Al | Al |
| $V_{th}$ (V) | 2.4 | 1.8 |
| $I_{OFF}$ @½ $V_{th}$ (nA) | 0.3 | 0.08 |
| $I_{ON}$ @½ $V_{th}$ (nA) | 2,800 | 26,850 |

EXAMPLE 14

Substrates comprising indium tin oxide (ITO) on glass were patterned lithographically. The width of the patterned ITO electrodes was 0.2 mm. The electric field programmable film is formed by spin-coating 1,2-dichlorobenzene solution containing 1.6% PS, 0.6% 8HQ and 0.45% Au NPs (from Example 2) on patterned ITO on glass substrates. The films were baked at 80° C. for 30 minutes. The top Al electrodes of 0.2 mm width were deposited at a vacuum of $10^{-5}$ Torr. Electrical bistable behavior was obtained with a threshold voltage at 2.0 V, an OFF current of 55 nA at 1.0 V and an ON current of 3,900 nanoamperes (nA) at 1.0V.

EXAMPLES 15-21

Devices in Examples 15-21 were fabricated by the same process as Example 5. The results are shown in Table 5. The substrate is glass, the top and bottom electrodes were manufactured from Al having a 0.2 mm width. The solution for the electric field programmable film was 1.2% PS, Au NP (from Example 1) of various concentrations and 8HQ of various concentrations.

TABLE 5

| | Example | | | | | | |
| --- | --- | --- | --- | --- | --- | --- | --- |
| | 15 | 16 | 17 | 18 | 19 | 20 | 21 |
| Concentration of Au NP (%) | 0.01 | 0.1 | 0.5 | 1 | 0.3 | 0.3 | 0.3 |
| Concentration of 8HQ (%) | 0.4 | 0.4 | 0.4 | 0.4 | 0.12 | 0.6 | 1.2 |
| $V_{th}$ (V) | 3.1 | 2.5 | 2.5 | 2.4 | 3 | 2.5 | 2.6 |
| $I_{OFF}$ @½$V_{th}$ (nA) | 0.46 | 0.36 | 0.46 | 0.55 | 8.6 | 0.46 | 22 |
| $I_{ON}$ @½$V_{th}$ (nA) | 6,700 | 5,200 | 3,600 | 2,000 | 820 | 4,500 | 4,200 |

EXAMPLE 22

Devices were fabricated by the same process as in Example 5. The formulation for producing the electric field programmable film contained 1.2% PS and 0.4% 8HQ in 1,2-dichlorobenzene without Au NP. An electrical transition takes place at 2.1V. The current is 0.68 and 8,300 nA at 1.0V in the OFF and ON states, respectively. The device in the ON state could not be turned to the OFF state by applying a negative bias

EXAMPLE 23

An I-V curve of the device of example 5 was tested under a vacuum of $10^{-3}$ Torr. The OFF current at half threshold voltage was $3.5\times10^{-3}$ nA, the ON current at half threshold voltage was $3.5\times10^3$ nA.

EXAMPLE 24

The I-V curve of the device of example 5 was tested in nitrogen atmosphere (glove box filled with nitrogen). The OFF current at half threshold was 0.1 nA, and the ON current at half threshold was 1,000 nA.

EXAMPLE 25

The device of Example 13 was operated by the following procedures. (1) A pulse of 0.9 V was applied to the device at the OFF state to obtain a current of 0.1 nA (this can be defined as "off"); (2) A pulse of 2.5 V with a pulse width of 1 μs was applied; (3) A pulse of 0.9 V was applied to the device obtaining a current of 2,700 nA (this can be defined as "on"); (3) A pulse of –0.8 V with a pulse width of 1 μs was applied to the device; (5) A pulse of 0.9V was applied to obtain a current of 0.1 nA ("off").

EXAMPLE 26

The device of Example 8 was operated according to the following procedures. (1) A pulse of 3.0 V was applied to the device at the "off" state and a current of 0.5 nA was obtained; (2) A pulse of 6.5 V with a pulse width of 1 μs was applied; (3) Aa pulse of 3.0 V was applied to the device and a current of 1,730 nA was obtained (this can be defined as "on"); (3) Aa pulse of –4.0 V with a pulse width of 1 μs was applied to the device; (5) Aa pulse of 3.0 V was applied to the device to obtain a current of 0.5 nA ("off").

EXAMPLE 27

A voltage pulse of 5 V with the width of 50 ns was applied to the devices of example 7 in the "off" state. After applying the pulse, the device turned to the "on" state.

EXAMPLE 28

Al electrodes were formed on a glass substrate by thermal evaporation as before. A PEDOT-PSS (available from Bayer) coating of about 30 nm was then spin coated on Al/glass. The electric field programmable film was formed by spin-coating a solution of 1,2-dichlorobenzene of 1.2% PS, 0.4% Au NPs (from Example 2) and 0.4% 8HQ. A top Al electrode was then formed by thermal evaporation. The device had stability at the ON and OFF state and the I-V curve was unsymmetrical in the positive and negative bias.

Figure 8:
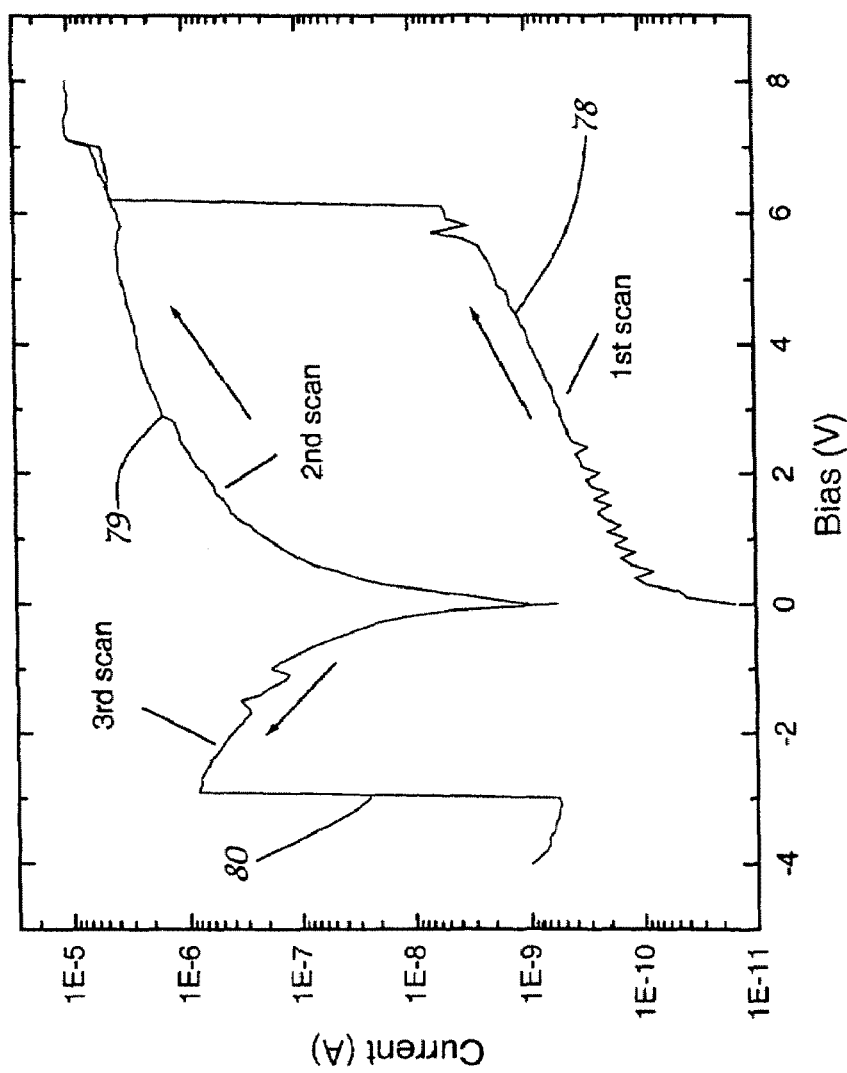
FIG. 8 is a graphical representation of current vs. applied voltage for the device of FIG. 1(b).

In FIG. 8 are provided plots of current vs. applied voltage for the device of FIG. 1(b), wherein an electric field programmable film of approximately 100 nm thickness was spin-cast from a solution comprising 0.4 wt % gold nanoparticle electron donor, 0.4 wt % 9,10-dimethylanthracene electron acceptor, 1.2 wt % polystyrene matrix material and 98 wt % 1,2-dichlorobenzene solvent, wherein the weight percents were based on the total weight of the electric field programmable film composition. After coating, the film and substrate were baked at 80° C. for 30 minutes on a hotplate. The first and second electrodes contained evaporated aluminum cross point electrodes having a width of 0.2 mm, configured so that the electric field programmable film was positioned between the electrodes. The programmed voltage source and current measurements were provided by an Agilent 4145B semiconductor parameter tester. A first forward voltage scan, 78, from 0 to 8 V was performed, indicating a first current transition from "off" to "on" at approximately 6.2 V. A second voltage scan from 0 to 8 V, 79, showed a "high" current condition from 0 to 6.2 V, in distinction to the low current condition observed in the previous plot, 78. During a third voltage scan from 0 to –4 V, 80, a second current transition was induced from "on" to "off" at approximately –3 V.

We claim:

1. A composition for the formation of an electric field programmable film, the composition comprising
   a matrix precursor composition or a dielectric matrix material; wherein the dielectric matrix material comprises an organic polymer and/or a inorganic oxide; and
   an electron donor and an electron acceptor of a type and in an amount effective to provide electric field programming, wherein the electron donor consists essentially of nanoparticles having sizes in a range of 1 nm to 100 nm.

2. The composition of claim 1, wherein the matrix precursor composition comprises styrene, 4-hydroxystyrene, $C_1$-$C_{10}$ linear, branched or cyclic alkyl, $C_1$-$C_{10}$ linear, branched, or cyclic alkoxy, $C_1$-$C_{10}$ aryl or aralkyl, or $C_6$-$C_{10}$ aryloxy or aralkyloxy substituted styrene, vinyl acetate, vinyl alcohol, (meth)acrylonitrile, (meth)acrylic acid, $C_1$-$C_{10}$ linear, branched or cyclic alkyl or $C_6$-$C_{10}$ aryl or aralkyl (meth) acrylate esters, $C_1$-$C_{10}$ linear, branched or cyclic alkyl or $C_6$-$C_{10}$ aryl or aralkyl cyanoacrylate esters, $C_1$-$C_{10}$ linear, branched, or cyclic alkoxy, $C_6$-$C_{10}$ aryl, arylalkyl, aryloxy or arylalkyloxy dialcohols; $C_1$-$C_{10}$ linear, branched, cyclic alkoxy, $C_6$-$C_{10}$ aryl, arylalkyl, aryloxy or arylalkyloxy diacids, $C_1$-$C_{10}$ linear, branched, or cyclic alkoxy; $C_1$-$C_{10}$ aryl, arylalkyl, aryloxy or arylalkyloxy dialcohols; $C_1$-$C_{10}$ linear, branched, or cyclic alkoxy, $C_6$-$C_{10}$ aryl, arylalkyl, aryloxy or arylalkyloxy diacids, $C_1$-$C_{10}$ linear, branched, or cyclic alkoxy, $C_6$-$C_{10}$ aryl, arylalkyl; aryloxy or arylalkyloxy diamines, polymerizable oligomers comprising at least one of the foregoing monomers, polymerizable polymers comprising at least one of the foregoing monomers, or a combination comprising at least one of the foregoing monomers, oligomers, or polymers, and further wherein polymerization of the matrix precursor composition provides a dielectric matrix material.

3. The composition of claim 1 wherein the dielectric matrix material is a homopolymer or copolymer and has a dielectric constant of greater than 2.

4. The composition of claim 1 wherein the dielectric matrix material is a homopolymer or copolymer and has a dielectric constant of 2 to 500.

5. The composition of claim 1, wherein the organic polymer is a polyolefins, poly (meth)acrylates, polyesters, polyamides, novolacs, polysiloxanes, polycarbonates, polyimides, polyacetates, polyalkyds, polyamideimides, polyarylates, polyurethanes, polyarylsulfone, polyethersulfone, polyphenylene sulfide, polyvinyl chloride, polysulfone, polyetherimide, polytetrafluoroethylene, polychlorotrifluoroethylene, polyvinylidene fluoride, polyvinyl fluoride, polyetherketone, polyether etherketone, polyether ketone ketone or a combination comprising at least one of the foregoing organic polymers.

6. The composition of claim 1, wherein the inorganic oxide is a composition of the formula $$A_w B_x C_y O_z$$

where w, x, and y are 0 to 30, and z is 1 to 60; A is calcium, strontium, or barium, B is bismuth, zirconium, nickel or lead, and C is titanium, niobium zirconium vanadium, or tantalum and wherein stoichiometry of the inorganic oxides is constrained to give, approximate charge neutrality.

7. The composition of claim 1, wherein the electron acceptor is 8-hydroxyquinoline, phenothiazine, 9,10-dimethylanthracene, pentafluoroaniline, phthalocyanine, perfluorophthalicyanine , tetraphenylporphine, copper phthalocyanine, copper perfluorophthalocyanine, copper tetraphenylporphine, 2-(9-dicyanomethylene-spiro[5.5]undec-3-ylidene)-malononitrile, 4-phenylazo-benzene-1,3-diol, 4-(pyridin-2-ylazo)-benzene-1,3-diol, benzo[1,2,5]thiadiazole-4,7-dicarbonitrile, tetracyanoquinodimethane, quinoline, chlorpromazine, tetraphenylporphine, or a combination comprising at least one of the foregoing electron acceptors.

8. The composition of claim 1, wherein the electron donor is an organic electron donor or an inorganic electron donor.

9. The composition of claim 8, wherein the organic electron donors are tetrathiafulvalene, 4,4',5-trimethyltetrathiafulvalene, bis(ethylenedithio)tetrathiafulvalene, p-phenylenediamine, N-ethylcarbazole, tetrathiotetracene, hexamethylbenzene, tetramethyltetraselenofulvalene, or hexamethylenetetraselenofulvalene.

10. The composition of claim 8, wherein the inorganic electron donor comprises metal-halide salts or the acetylacetonate complexes of transition metals that are reduced by $K^+$ $BEt_3H^-$ or $NR4^+Bet_3H^-$ and stabilized using tetrahydrofuran, tetrahydrothiophene, quaternary ammonium salts or betaine surfactants.

11. The composition of claims 8, wherein the electron donor has a protective organic or inorganic shell.

12. The composition of claim 1, further comprising donor-acceptor complexes, wherein the donor-acceptor complexes are tetrathiafulvalene tetracyanoquinodimethane; hexamethylenetetrathiafulvalene-tetracyanoquinodimethane; tetraselenafulvalene-tetracyanoquinodimethane; hexamethylenetetraselenafulvalene-tetracyanoquinodimethane; methylcarbazole-tetracyanoquinodimethane; tetra methyl tetraselenofulvalene-tetracyanoquinodimethane; metal nanoparticle-tetracyanoquinodimethane complexes comprising gold, copper, silver or iron, ferrocene-tetracyanoquinodimethane complexes; tetrathiotetracene, tetramethyl-p-phenylenediamine, or hexamethylbenzene-tetracyanoquinodimethane complexes; tetrathiafulvalene, hexamethylenetetra thiafulvalene, tetraselenafulvalene, hexamethylenetetraselenafulvalene, or tetramethyltetraselenofulvalene-N-alkylcarbazole($C_1$-$C_{10}$, linear or branched) complexes; tetrathiotetracene, tetramethyl-p-phenylenediamine, or hexamethylbenzene-Buckminsterfullerene $C_{60}$ complexes; tetrathiafulvalene, hexamethylenetetrathiafulvalene, tetraselenafulvalene, hexamethylenetetraselenafulvalene, tetramethyltetraselenofulvalene-N-alkylcarbazole($C_1$-$C_{10}$, linear or branched) complexes; tetrathiotetracene, tetramethyl-p-phenylenediamine, or hexamethylbenzene-tetracyanobenzene complexes; tetrathiafulvalene, hexamethylenetetrathiafulvalene, tetraselenafulvalene, hexamethylenetetraselenafulvalene, or tetramethyltetraselenofulvalene-N-alkylcarbazole($C_1$-$C_{10}$, linear or branched) complexes; tetrathiotetracene, tetramethyl-p-phenylenediamine, or hexamethylbenzene-tetracyanoethylene complexes; tetrathiafulvalene, hexamethylenetetrathiafulvalene, tetraselenafulvalene, hexamethylenetetraselenafulvalene, or tetramethyltetraselenofulvalene-N-alkylcarbazole($C_1$-$C_{10}$, linear or branched) complexes; tetrathiotetracene, tetramethyl-p-phenylenediamine, hexamethylbenzene-p-chloranil complexes, or a combination comprising at least one of the foregoing donor-acceptor complexes.

13. The composition of claim 1, further comprising a solvent.

14. An electric field programmable film comprises:
a dielectric matrix material, wherein the dielectric matrix material comprises an organic polymer and/or a inorganic oxide;
an electron donor; and
an electron acceptor, wherein the electron donor consists essentially of nanoparticles having sizes in a range of 1 nm to 100 nm.

15. A data storage device comprising the film of claim 14.

16. A cross point array comprising the film of claim 14.

17. A method for manufacturing an electric field programmable film comprising:
applying the composition of claim 1 to a substrate; and
removing the solvent from the applied composition to form a film.

18. A film manufactured by the method of claim 17.

* * * * *

UNITED STATES PATENT AND TRADEMARK OFFICE
CERTIFICATE OF CORRECTION

PATENT NO. : 7,557,372 B2  Page 1 of 1
APPLICATION NO. : 11/882225
DATED : July 7, 2009
INVENTOR(S) : Yang et al.

It is certified that error appears in the above-identified patent and that said Letters Patent is hereby corrected as shown below:

Column 1, line 13, change "F49620-02-1-0427" to "F49620-01-1-0427"

Signed and Sealed this

Fourth Day of May, 2010

David J. Kappos
*Director of the United States Patent and Trademark Office*